United States Patent
Miyoshi

(10) Patent No.: US 8,514,904 B2
(45) Date of Patent: Aug. 20, 2013

(54) NITRIDE SEMICONDUCTOR LASER DIODE

(75) Inventor: Takashi Miyoshi, Anan (JP)

(73) Assignee: Nichia Corporation, Anan-shi (JP)

(*) Notice: Subject to any disclaimer, the term of this patent is extended or adjusted under 35 U.S.C. 154(b) by 0 days.

(21) Appl. No.: 13/387,855

(22) PCT Filed: Jul. 26, 2010

(86) PCT No.: PCT/JP2010/062527
§ 371 (c)(1),
(2), (4) Date: Apr. 10, 2012

(87) PCT Pub. No.: WO2011/013621
PCT Pub. Date: Feb. 3, 2011

(65) Prior Publication Data
US 2012/0189030 A1    Jul. 26, 2012

(30) Foreign Application Priority Data

Jul. 31, 2009    (JP) .................................. 2009-179810

(51) Int. Cl.
*H01S 5/00*    (2006.01)
(52) U.S. Cl.
USPC ................ 372/45.012; 372/45.01; 372/44.01; 372/44.011
(58) Field of Classification Search
USPC .................. 372/45.012, 45.01, 44.01, 44.011
See application file for complete search history.

(56) References Cited

U.S. PATENT DOCUMENTS

| 6,399,966 B1 | 6/2002 | Tsuda et al. |
| 6,586,762 B2 | 7/2003 | Kozaki |
| 6,586,779 B2 | 7/2003 | Tsuda et al. |

(Continued)

FOREIGN PATENT DOCUMENTS

| JP | 2000-236142 | 8/2000 |
| JP | 2001-057461 | 2/2001 |

(Continued)

OTHER PUBLICATIONS

Enya, Y. et al. "531 nm Green Lasing of InGaN Based Laser Diodes on Semi-Polar (2021) Free-Standing GaN Substrates", Applied Physics Express, 2009, vol. 2, pp. 082101-1 to 082101-3.

(Continued)

*Primary Examiner* — Kinam Park
(74) *Attorney, Agent, or Firm* — Foley & Lardner LLP

(57) ABSTRACT

A nitride semiconductor laser diode includes a substrate, an n-side nitride semiconductor layer formed on the substrate, an active layer formed on the n-side nitride semiconductor layer and having a light emitting layer including $In_xAl_yGa_{1-x-y}N$ ($0<x<1$, $0 \le y<1$, $0<x+y<1$), and a p-side nitride semiconductor layer formed on the active layer. In the nitride semiconductor laser diode, the lasing wavelength of the nitride semiconductor laser diode is 500 nm or greater, dislocations originated in the active layer penetrate through the p-side nitride semiconductor layer, with the dislocation density in the p-side nitride semiconductor layer being $1 \times 10^6$ cm$^{-2}$ or greater, and the concentration distribution of p-type impurities in the depth direction is such that, from the light emitting layer toward the surface of the p-side nitride semiconductor layer, the concentration of the p-type impurity reaches a maximum value of $5 \times 10^{18}$ cm$^{-3}$ or greater within a range of 300 nm from the top portion of the light emitting layer which is closest to the p-side nitride semiconductor layer, and after reaching the maximum value, the concentration remains at $6 \times 10^{17}$ cm$^{-3}$ or greater in the above-described range of 300 nm.

15 Claims, 9 Drawing Sheets

(56) References Cited

U.S. PATENT DOCUMENTS

| | | | |
|---|---|---|---|
| 6,711,191 B1 | 3/2004 | Kozaki et al. | |
| 6,838,693 B2 | 1/2005 | Kozaki | |
| 6,838,705 B1 | 1/2005 | Tanizawa | |
| 6,909,120 B2 | 6/2005 | Tsuda et al. | |
| 7,015,053 B2 | 3/2006 | Kozaki et al. | |
| 7,119,378 B2 | 10/2006 | Kozaki | |
| 7,348,602 B2 | 3/2008 | Tanizawa | |
| 7,496,124 B2 | 2/2009 | Kozaki et al. | |
| 7,646,009 B2 | 1/2010 | Kozaki | |
| 7,750,337 B2 | 7/2010 | Kozaki | |
| 8,030,682 B2 | 10/2011 | Fujikura | |
| 2002/0053665 A1* | 5/2002 | Tsuda et al. | 257/14 |
| 2002/0053676 A1* | 5/2002 | Kozaki | 257/88 |
| 2004/0101986 A1* | 5/2004 | Kozaki et al. | 438/22 |
| 2005/0035360 A1 | 2/2005 | Tanizawa | |
| 2005/0095768 A1* | 5/2005 | Tsuda et al. | 438/200 |
| 2008/0081015 A1* | 4/2008 | Sarayama et al. | 423/409 |
| 2009/0050928 A1* | 2/2009 | Fujikura | 257/103 |
| 2010/0230713 A1* | 9/2010 | Minemoto et al. | 257/103 |
| 2010/0252811 A1 | 10/2010 | Kozaki | |

FOREIGN PATENT DOCUMENTS

| | | |
|---|---|---|
| JP | 2001-148507 | 5/2001 |
| JP | 2002-026459 | 1/2002 |
| JP | 2002-084040 | 3/2002 |
| JP | 2002-151738 | 5/2002 |
| JP | 2007-305635 | 11/2007 |
| JP | 2007-335854 | 12/2007 |
| JP | 2008-110910 | 5/2008 |
| JP | 2009-046368 | 3/2009 |
| WO | WO-02/05399 A1 | 1/2002 |
| WO | WO-2007/083768 A1 | 7/2007 |

OTHER PUBLICATIONS

International Preliminary Report on Patentability in PCT/JP2010/062527 dated Feb. 16, 2012.

International Search Report in PCT/JP2010/062527 dated Aug. 31, 2010.

Miyoshi, T. et al. "510-515 nm InGaN-Based Green Laser Diodes on c-place GaN Substrate", Applied Physics Express, 2009, vol. 2, pp. 062201-1 to 062201-3.

* cited by examiner

NITRIDE SEMICONDUCTOR LASER DIODE

BACKGROUND OF THE INVENTION

1. Field of the Invention

The present invention relates to a nitride semiconductor laser diode using a nitride semiconductor represented by $Al_xIn_yGa_{1-x-y}N$ (0 x 1, 0 y 1, 0 x+y 1).

2. Description of Related Art

A semiconductor laser diode using a compound semiconductor is widely used in applications such as optical disc systems capable of recording and/or reproducing large volume, high-density information. Meanwhile, a new application for semiconductor laser diodes which will provide a full color display with a combination of blue, green, and red semiconductor lasers is expected to be realized.

Among blue, green, and red of the three principal colors of light, blue and red semiconductor laser diodes are already in practical use with employing Group III-V compound semiconductors such as InAlGaN and AlInGaP. In contrast, as for a green laser, a laser device capable of emitting a green beam has been developed by converting wavelength using second harmonic generation (SHG). However, a direct green laser diode capable of directly emitting a green beam has not yet been put into practical use.

As for a semiconductor laser diode capable of directly emitting green light, a laser diode using a Group II-VI compound semiconductor was reported around 1993, but because of its poor reliability at high current condition, its practical use was not realized. For this reason, in recent years realization of a semiconductor laser diode capable of directly emitting green light with a use of a Group III-V nitride semiconductor is expected.

As for a Group III-V nitride semiconductor, a semiconductor laser diode using a light emitting layer made of $In_xAl_yGa_{1-x-y}N$ (0<x, 0 y<1, 0<x+y<1), particularly made of InGaN, (hereinafter referred simply as "InGaN light emitting layer") and capable of emitting ultraviolet to blue light is already in practical use (Patent Reference 1 etc.). When the In content in the InGaN light emitting layer is increased, the band gap becomes smaller and the emission wavelength becomes greater and emission of green light becomes possible. However, in the case where the InGaN light emitting layer is grown by vapor phase epitaxy, the lattice mismatch with respect to GaN layer which is an underlayer thereof, becomes greater with increase of In content, and InGaN layer itself becomes chemically unstable and phase separation tends to occur. For this reason, the realization of a semiconductor laser capable of emitting green light, by way of increasing the In content in the InGaN light emitting layer is not easy.

In Patent Reference 2, a semiconductor laser diode capable of emitting light in a wide range of wavelengths including green is proposed, in which InGaNP, obtained by a part of Group V element in InGaN substituted with P is used as the light emitting layer. According to Patent Reference 2, using InGaNP as the light emitting layer enables P, which is a Group V element having less volatile than N, to combine with In, thus segregation of In can be prevented. In addition, bowing effect of band gap due to the change in the content of P is large, so that the content of In necessary to obtain a desired emission wavelength can be reduced compared to that in a conventional InGaN light emitting layer. Also, Patent Reference 3 proposes an addition of an impurity such as Mg, Be, C, or Si to InGaNP light emitting layer to prevent separation of crystalline system in the InGaNP light emitting layer.

In contrast, recently, the inventors of the present invention improve the crystal quality of the InGaN light emitting layer having a high content of In by optimizing its growth condition and succeeded in producing continuous lasing at room temperature up to 515 nm in a semiconductor laser diode using an InGaN light emitting layer, and reported in Non-patent Reference 1. The green semiconductor laser exhibited output power of 5 mW at 25° C. and estimated operating life at room temperature was 5000 hr or greater.

Patent Reference 1: WO 2002-05399
Patent Reference 2: JP 2002-26459A
Patent Reference 3: JP 2002-84040A
Non-patent Document 1: T. Miyoshi et. al., "510-515 nm InGaN-Based Green Laser Diode on c-Plane GaN substrate", Applied Physics Express 2(2009), 062201.

DISCLOSURE OF THE INVENTION

Problem to be Solved by the Invention

However, the green semiconductor laser diode using the InGaN light emitting layer described above did not yet have sufficient life characteristics. As shown in Non-patent Reference 1, a 510-513 nm wavelength green semiconductor laser diode exhibits a stable driving current to 500 hours in a life test at room temperature operation, and the operating life at room temperature which is estimated from the test was 5000 hours or greater (see Non-patent Reference 1, FIG. 8). However, in a high temperature operation at 60° C. performed as accelerated test, sharp deterioration was observed from immediately after starting operation, and the operating life in high temperature operation was only several tens of hours.

According to the findings by the inventors of the present invention, the life characteristics of the semiconductor laser diode using InGaN light emitting layer is strongly affected by the wavelength, and the life characteristics sharply decreases when the wavelength is 500 nm or greater. It is conventionally known that with an increase in the In content in InGaN light emitting layer, lattice mismatch with the GaN layer which is the under layer increases and dislocations are generated at the interface between the InGaN layer and the GaN layer. It has also been known that with a increase in dislocation density in a laser diode element, the life characteristics decreases. However, the cause of the decrease in the life characteristics with the increase in the dislocation density is thought to be that the dislocations act as non-radiative dislocation centers. For this reason, conventionally, in order to prevent decrease in life characteristics with increasing emission wavelength, efforts have been exerted to reduce the generation of dislocations.

For example, reducing the thickness of the InGaN light emitting layer facilitates reduction of distortion caused by lattice mismatch with the GaN layer which is the underlayer thereof, and generation of dislocations can be prevented to some degree. However, when the InGaN light emitting layer is made thin, the efficiency of carrier containment in the InGaN light emitting layer drops, which causes an increase in the threshold current.

Meanwhile, in Patent Reference 2 and Patent Reference 3, InGaNP or InGaNAs is used for the light emitting layer, instead of InGaN, and thus a desired wavelength with a small In content is obtained. With this arrangement, prevention of segregation of In and reduction of lattice mismatch are aimed (Patent Reference 2, paragraph [0041]). However, introduction of As or P in the InGaN light emitting layer tends to lead to deterioration of the crystal quality of light emitting layer. Further, in a light emitting layer containing As or P, segregation of As or P tends to occur in the vicinity of dislocations which leads to deterioration of the crystal quality of the light emitting layer, so that reduction in the light emitting efficiency and increase in threshold current tend to result (Patent Reference 3, paragraph [0012]).

Accordingly, an object of the present invention is, in a nitride semiconductor laser diode using an InGaN light emitting layer and having lasing wavelength of 500 nm or greater, suppressing deterioration of life characteristics associated with a long lasing wavelength while favorably maintaining confinement of carriers in the InGaN light emitting layer and its crystal quality to realize a long-wavelength nitride semiconductor laser diode excellent in light emitting efficiency and life characteristics.

Means to Solve the Problem

The inventors of the present invention have diligently studied and discovered that a rapid decline in life characteristics in a nitride semiconductor laser diode of lasing wavelength 500 nm or greater is not caused by the dislocations themselves, but due to the effect of the dislocations, activation of the p-type impurity is inhibited by the effect of dislocations and the resulting insufficient supply of holes to the InGaN light emitting layer causes the decline in the life characteristics. According to the present invention, while increasing the In content and allowing the generation of dislocations in the active layer, the concentration of a p-type impurity within a predetermined distance from the InGaN light emitting layer is controlled in a predetermined range. Thus, lasing at a long wavelength of 500 nm or greater is realized and the life characteristics is dramatically improved.

That is, a nitride semiconductor laser diode according to the present invention includes a substrate, an n-side nitride semiconductor layer containing an n-type impurity and disposed on the substrate, an active layer having a light emitting layer including $In_xAl_yGa_{1-x-y}N$ ($0<x<1$, $0 \leq y<1$, $0<x+y<1$) and disposed on the n-side nitride semiconductor layer, and a p-side nitride semiconductor layer containing a p-type impurity and disposed on the active layer. The lasing wavelength of the nitride semiconductor laser diode is 500 nm or greater. Dislocations originated in the active layer penetrate through the p-side nitride semiconductor layer with a dislocation density of $1 \times 10^6$ cm$^{-2}$ or greater, and a concentration distribution of the p-type impurity in a depth direction, from the light emitting layer toward the surface of the p-side nitride semiconductor layer, has a local maximum with the concentration of the p-type impurity of $5 \times 10^{18}$ cm$^{-3}$ or greater in a range within 300 nm from the top surface of the light emitting layer which is the closest layer to the p-side nitride semiconductor layer, and after passing the local maximum, the p-type concentration is not less than $6 \times 10^{17}$ cm$^{-3}$ in the range within 300 nm.

Here, the term "local maximum" in the concentration distribution of a p-type impurity in a depth direction refers to a place where the concentration of the p-type impurity changes from increasing to decreasing. Conversely, the term "local minimum" refers to a place where the concentration of the p-type impurity changes from decreasing to increasing. Here, the expression "increasing" or "decreasing" includes not only the cases where the concentration of p-type impurity with respect to the depth changes in a continuous manner but also the cases where it changes in a discontinuous manner.

In the conventional short wavelength nitride semiconductor laser diode, when the concentration of p-type impurity in the vicinity of the light emitting layer becomes greater, internal loss due to optical absorption increases, which may cause an increase in threshold current and decrease in slope efficiency. For this reason, it has been known that the doping amount of p-type impurity is better to be small in the vicinity of the light emitting element. Also, the dislocations act as non-radiative recombination centers, so that it has been a common practice to reduce generation of dislocations in the light emitting layer to a minimum. On the contrary, in the present invention, the concentration of p-type impurity in the vicinity of the light emitting layer is increased compared to that in conventional methods and controlled in the range described above, while allowing the generation of dislocations in the active layer of a long wavelength nitride semiconductor laser diode. With this, life characteristics of nitride semiconductor laser diode in long wavelength region of 500 nm can be exponentially improved, and its estimated operating life at high-temperature operation, which has been conventionally only several tens of hours, can be extended at once to a practical level of more than several thousand hours. Such a dramatic improvement in the life characteristics by controlling the Mg concentration has not been observed in conventional short wavelength nitride semiconductor lasers and is a specific phenomenon to the long wavelength nitride semiconductor laser with lasing wavelength of 500 nm or greater. The reason for the phenomenon is not necessarily clear, but is considered below.

In the present invention, the dislocations associated with an increase in the In content in the InGaN light emitting layer is intentionally left in situ, thus enabling prevention of occurrence of problems such as an insufficient carrier confinement due to decrease in the thickness of the InGaN light emitting layer, and deterioration of crystal quality due to the introduction of other Group V elements. On the other hand, due to the increase of the In content for obtaining a lasing wavelength of 500 nm or greater, dislocations originated in the active layer occur. Thus, the dislocation density of a nitride semiconductor layer located above the light emitting layer increases, where the dislocation density in the p-side nitride semiconductor layer is at least $1 \times 10^6$ cm$^{-2}$. The degree of crystal quality of the nitride semiconductor layer decreases in the vicinity of dislocations, so that generation of holes by the p-type impurity becomes insufficient with increase of dislocation density, leading to insufficient supply of holes to the InGaN light emitting layer. As a result, the electrons diffuse to the p-side of the InGaN light emitting layer and cause non-radiative recombination that sharply reduces life characteristics. The sharp reduction in the life characteristics is not simply due to the dislocation density in the p-side nitride semiconductor layer but also depends on the origin of the dislocations. When the In content in the InGaN layer is increased to obtain a long lasing wavelength of 500 nm or greater, dislocations occur from the active layer. The dislocations originating from the active layer affect the crystal quality of the p-side nitride semiconductor layer, which leads to insufficient supply of holes to the InGaN light emitting layer, that sharply reduces life characteristics. Such a phenomenon is not observed with the dislocations propagating from the substrate. For example, even in a short wavelength nitride semiconductor laser diode with a low In content in the InGaN light emitting layer, if the dislocation density in the substrate is high, the dislocation density in the p-side nitride semiconductor layer may be $1 \times 10^6$ cm$^{-2}$ or greater. However, in such cases, the sharp change in the life characteristics due to the concentration of p-type impurity exhibited in the nitride semiconductor laser diode with lasing wavelength of 500 nm or greater is not observed. From this, it is thought that the dislocations originating from the active layer and the dislocations propagated from the substrate exert different effect on the p-side nitride semiconductor layer, and therefore the critical dependency on the concentration of p-type impurity which is characteristic of long wavelength as described above occurs. A large fraction of the dislocations originating in the active layer has its origin in the light emitting layer.

For this reason, in the present invention, the concentration distribution of p-type impurity in a depth direction is controlled so that in a range within 300 nm from the top surface of the light emitting layer which is the closest layer to the p-side nitride semiconductor layer, the concentration of the p-type impurity has a local maximum of $5 \times 10^{18}$ cm$^{-3}$ or greater, and not less than $6 \times 10^{17}$ cm$^{-3}$ after passing the local maximum and within the 300 nm range. Within the distance of 300 nm, which allows efficient supply of holes to the InGaN light emitting layer, the concentration of the p-type impurity is once increased to $5 \times 10^{18}$ cm$^{-3}$ or greater, and decreased to not less than $6 \times 10^{17}$ cm$^{-3}$. Thus, supply of holes to the InGaN light emitting layer is secured and occurrence of non-radiative recombination in the p-side of the InGaN light emitting layer is prevented, and accordingly, exponential improvement in the life characteristics can be achieved. Moreover, because light from the light emitting layer is concentrated in the region of about 300 nm from the top surface of the light emitting layer, the absorption of the emission by the p-type impurity can be suppressed while securing the supply of holes to the light emitting layer, by controlling the concentration of the p-type impurity so that the concentration once increases to $5 \times 10^{18}$ cm$^{-3}$ or greater and decreases to not less than $6 \times 10^{17}$ cm$^{-3}$.

Effect of the Invention

As described above, according to the present invention, in a nitride semiconductor laser diode of lasing wavelength 500 nm or greater, occurrence of the dislocations originating from the light emitting layer with an increase in the In content is intentionally left in situ. Thus, while favorably maintaining the carrier confinement in the InGaN light emitting layer and the crystal quality thereof, the concentration of p-type impurity present within a predetermined distance from the InGaN light emitting layer is controlled in a predetermined range, and thus exponential improvement in the life characteristics can be achieved. Accordingly, a long wavelength nitride semiconductor laser diode with excellent light emitting efficiency and life properties can be realized.

DETAILED DESCRIPTION OF PREFERRED EMBODIMENTS

Hereinafter, preferred embodiments of the present invention will be described with reference to the drawings. Each drawing is a schematic diagram and the arrangement, dimension, ratio, shape, and the like, may be altered.

Figure 1:
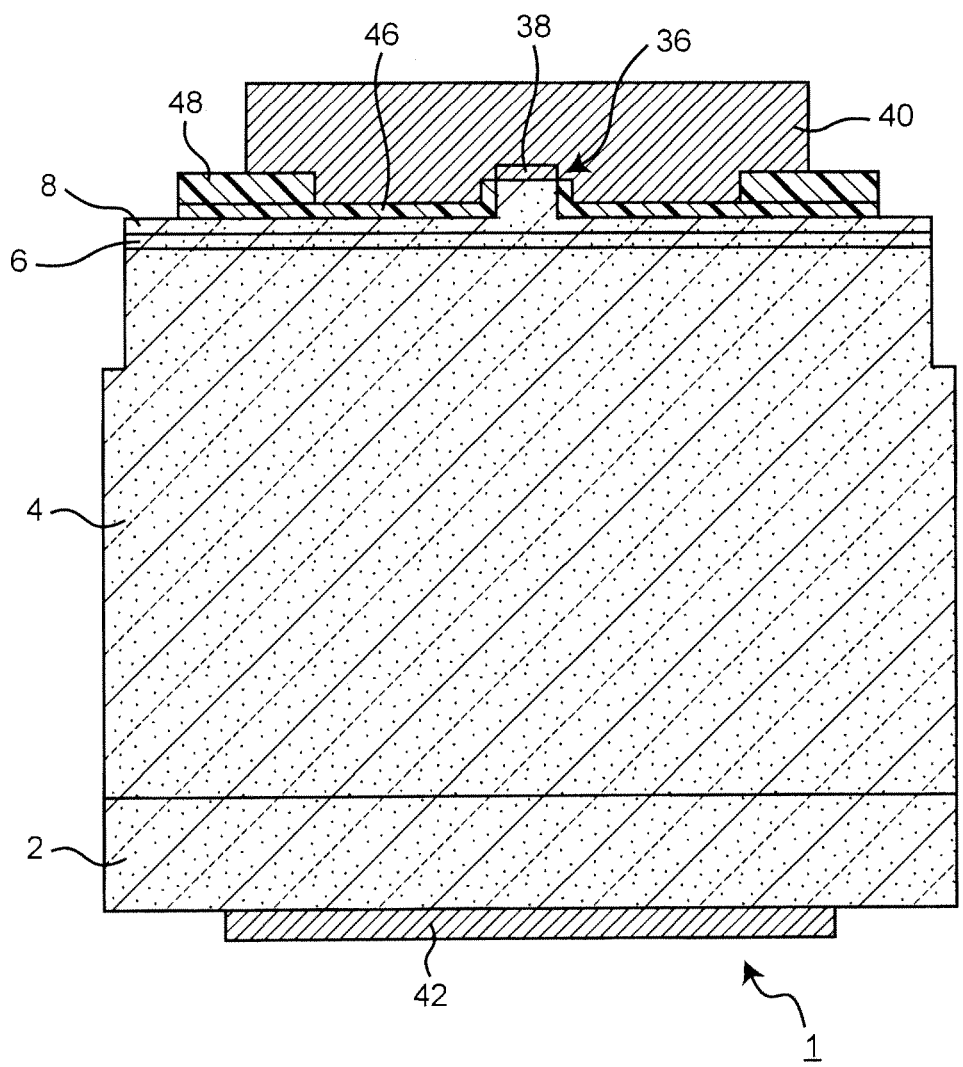
FIG. 1 is a schematic cross-sectional view showing an example of a nitride semiconductor laser diode according to the present invention.

FIG. 1 is a schematic cross-sectional view showing an example of a nitride semiconductor laser diode according to the present invention. On the substrate 2 made of a nitride semiconductor, an n-side nitride semiconductor layer 4 containing an n-type impurity such as Si, an active layer 6, and a p-side nitride semiconductor layer 8 containing a p-type impurity such as Mg, are stacked, and a ridge 36 constituting a waveguide is formed in a part of the p-side nitride semiconductor layer 8. The portion around the ridge 36 is covered with an embedded layer 46 and a protective film 48 is further disposed thereon. A p-side electrode 38 is disposed on a part of the p-side nitride semiconductor layer 8 which is exposed from the top of the ridge 36, and further, a p-side pad electrode 40 is disposed to cover the ridge 36 while being in contact with the p-side electrode 38. Meanwhile, an n-side electrode 42 is disposed on the back surface of the substrate 2 made of a nitride semiconductor.

Figure 2:
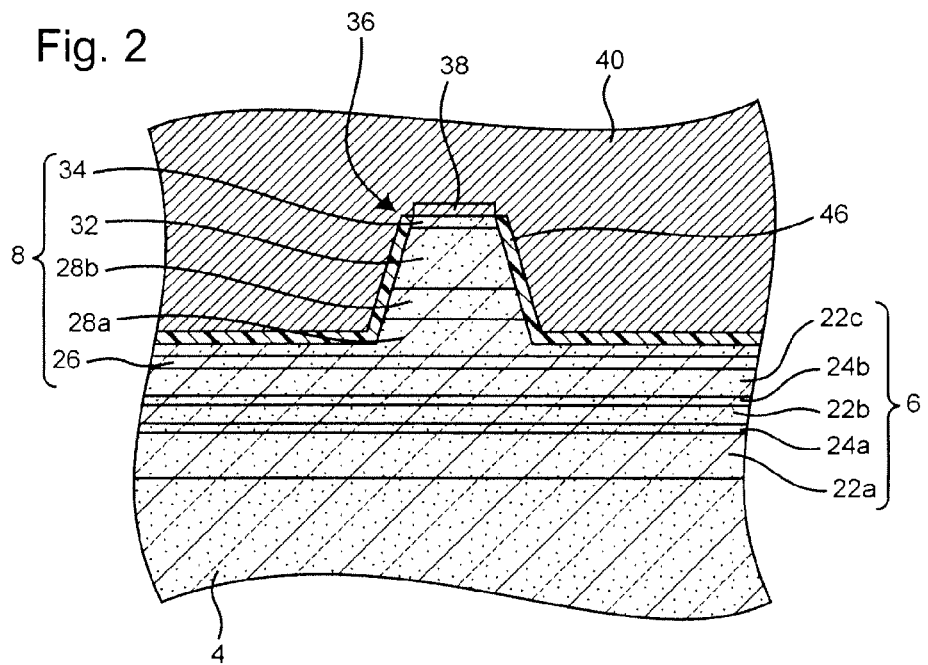
FIG. 2 is a partially enlarged schematic cross-sectional view of the active layer and the p-side nitride semiconductor layer of the nitride semiconductor laser diode shown in FIG. 1.

FIG. 2 is a partially enlarged schematic cross-sectional view of the active layer 6 and the p-side nitride semiconductor layer 8 of the nitride semiconductor laser diode shown in FIG. 1. The active layer 6 has a multiquantum well structure in which a barrier layer 22a, 22b, 22c made of InGaN or GaN and a well layer 24a, 24b made of InGaN are alternately stacked, where the InGaN well layers 24a, 24b serve as the light emitting layer. Also, as the p-side nitride semiconductor layer 8, an Al-containing nitride semiconductor layer 26 (first p-type nitride semiconductor layer), a p-side optical guide layer 28a, 28b (second p-type nitride semiconductor layer), a p-side cladding layer 32 (third p-type nitride semiconductor layer), and a p-side contact layer 34 are stacked in this order from the side closer to the active layer 6. The stripe structure having a layered structure shown in FIG. 1 and FIG. 2 constitutes the resonator cavity and thus provides an edge-emitting type laser diode.

Figure 3:
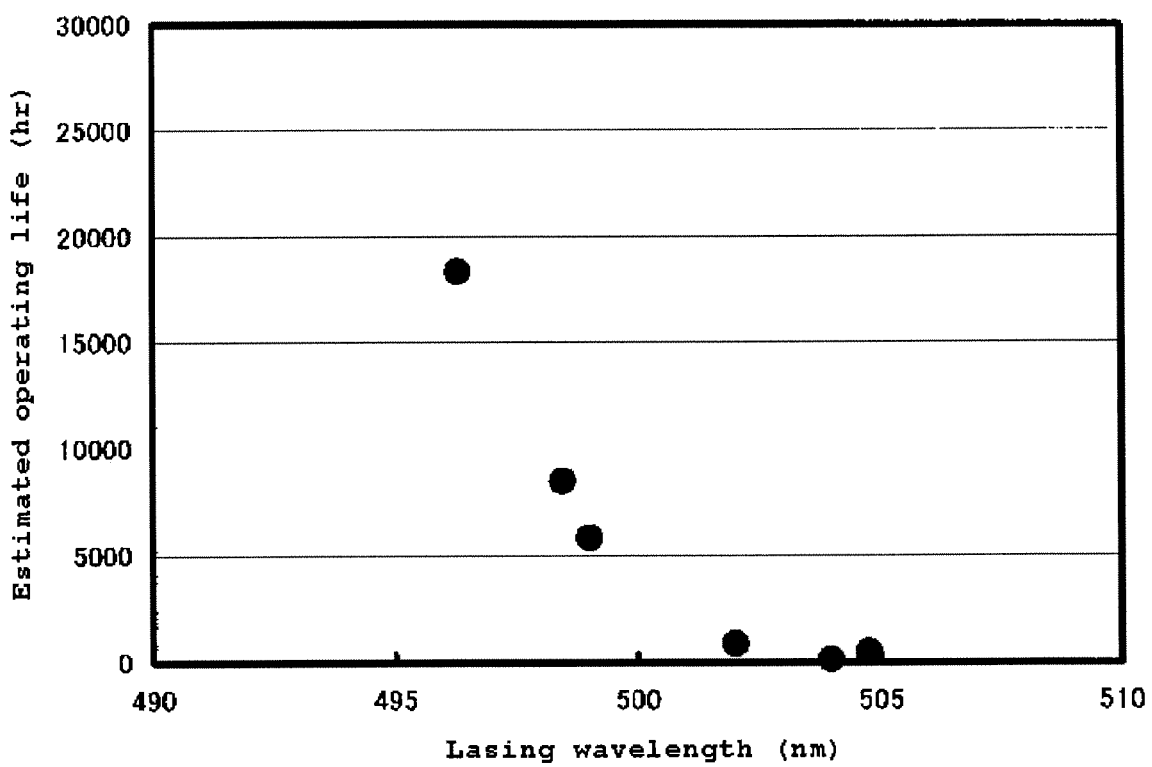
FIG. 3 is a diagram illustrating a relationship between the lasing wavelength and the estimated operating life of a nitride semiconductor laser diode.

The lasing wavelength of the nitride semiconductor laser diode shown in FIG. 1 can be selected variously by changing the In content in the InGaN layers 24a, 24b, in which, a longer lasing wavelength can be obtained with increasing the In content. However, the life characteristics of this nitride semiconductor laser shows strong dependency to its lasing wavelength, and the operating life decreases rapidly at an lasing wavelength beyond 500 nm. In FIG. 3, as for a nitride semiconductor laser diode having a structure as shown in FIG. 1, the estimated operating life is plotted versus the lasing wavelength, showing that the estimated operating life sharply decreases with the lasing wavelength approaching to 500 nm, and lasts only several tens of hours at a wavelength of 500 nm or greater.

Figure 4:
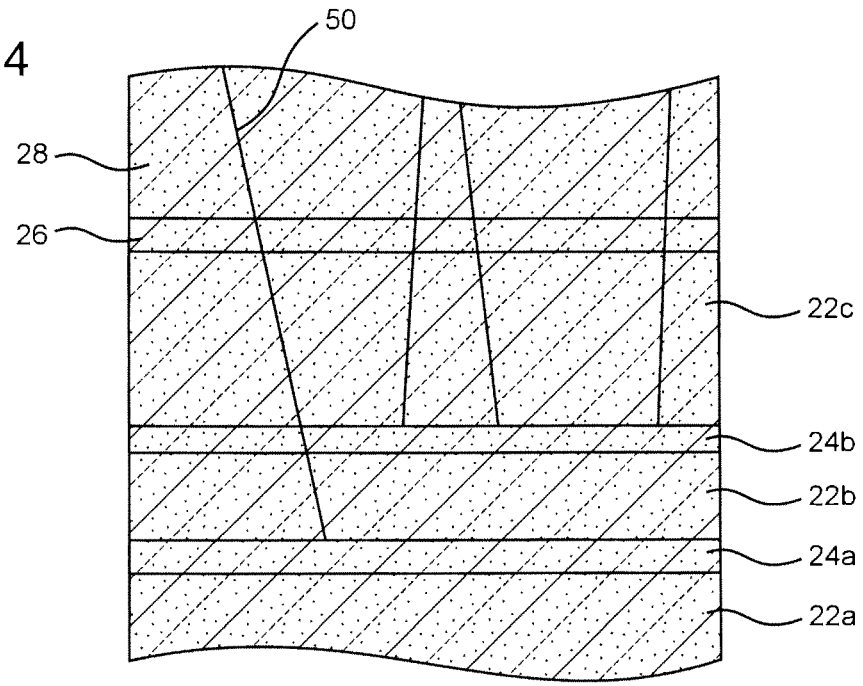
FIG. 4 is a cross-sectional view schematically illustrating generation of dislocations in an active layer.
Figure 5:
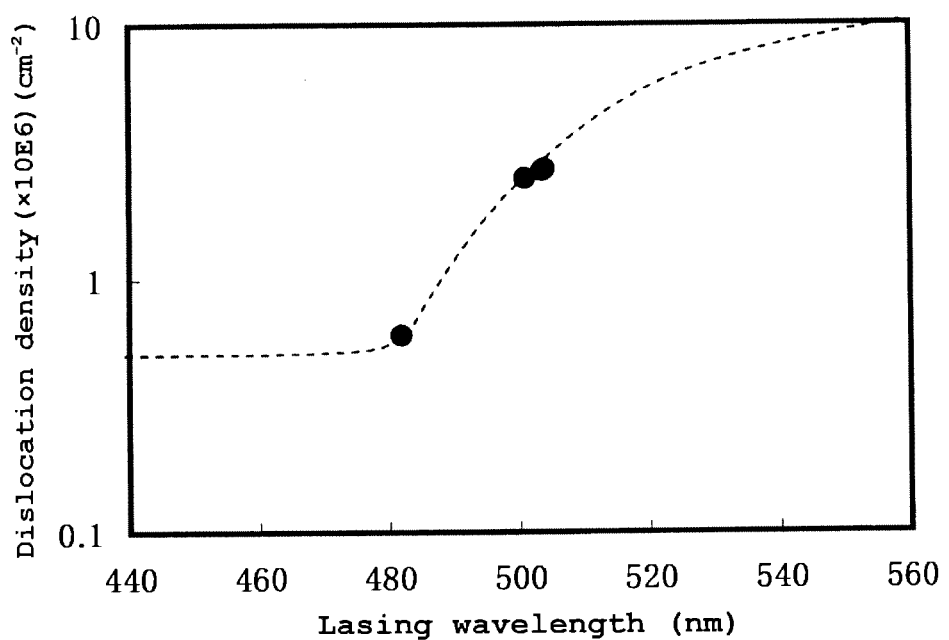
FIG. 5 is a diagram illustrating a relationship between the lasing wavelength and the dislocation density of a nitride semiconductor laser diode.

It is conventionally known that with an increasing in the In content in the InGaN well layers 24a, 24b, the lattice mismatch with the barrier layers 22a, 22b made of InGaN or GaN, which are the respective underlayers thereof, increases, leading to generation of new dislocations in the active layer 6. According to the research conducted by the inventors of the present invention, in an active layer 6 with a lasing wavelength exceeding 500 nm, as schematically shown in FIG. 4, a number of dislocations were generated at the interface between the InGaN well layer 24a and InGaN barrier layer 22a and the interface between the InGaN well layer 24b and the GaN barrier layer 22b. If the In content is increased to obtain a longer lasing wavelength, the generation of dislocations also increases accordingly. FIG. 5 is a diagram illustrating a relationship between the lasing wavelength and the dislocation density of the p-side nitride semiconductor layer 8, in a nitride semiconductor laser diode in which the dislocation density in the substrate 2 is about $5 \times 10^5$ cm$^{-2}$. In this case, the dislocations contained in the substrate is about $5 \times 10^5$ cm$^{-2}$, so that the value obtained by subtracting $5 \times 10^5$ from the value of dislocation density shown in FIG. 5 is the dislocations newly generated in the active layer 6. As shown in FIG. 5, at the lasing wavelength of about 480 nm, generation of the dislocations starts in the active layer 6 and the dislocation density originated in the active layer 6 increases with increasing of lasing wavelength. At the lasing wavelength of 500 nm, the dislocation density in the p-side nitride semiconductor layer 8 is $2 \times 10^6$ cm$^{-2}$ or greater. From this, it can be seen that dislocations of $1.5 \times 10^6$ cm$^{-2}$ or greater is generated at the lasing wavelength of 500 nm.

Increase in the dislocation density in a laser diode element has been known to cause a decrease of the life characteristics, but the reason for the decrease of the life characteristics due to the increase of the dislocation density has been thought that the dislocations themselves act as non-radiative recombination centers. Accordingly, the effort was focused on ways to reduce the generation of dislocations, in which a thinner layers were employed to relax the distortions associated with lattice mismatch between the InGaN well layers 24a, 24b and the barrier layers 22a, 22b, or a smaller In content was studied to obtain a desired wavelength. However, for the aim to reduce the generation of dislocations, if the thickness of the well layers 24a, 24b is reduced or other Group V element is added to the well layer, the bowing parameter is increased and which may lead to problems such as reduction in optical confinement in the well layers 24a, 24b, or deterioration of crystal quality of the well layers 24a, 24b.

Figure 6:
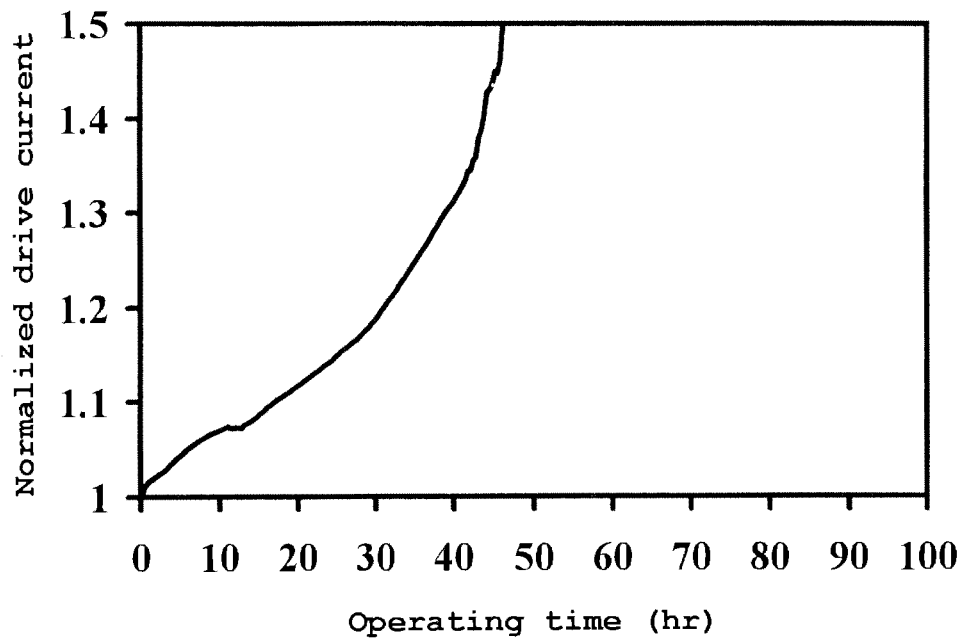
FIG. 6 is a diagram illustrating the result of a high-temperature life test of a nitride semiconductor laser diode of a comparative example.
Figure 7:
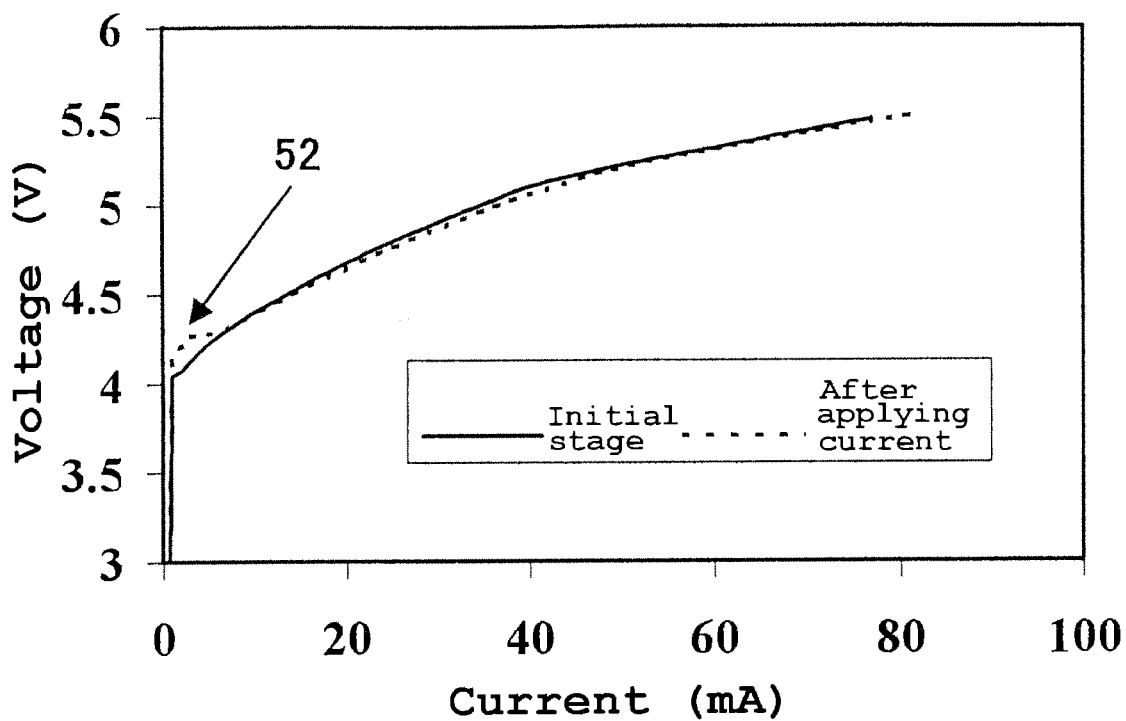
FIG. 7 shows I-V characteristic in the initial stage and after applying current of a nitride semiconductor laser diode of a comparative example.

Meanwhile, according to a study conducted by the inventors on deterioration behavior under high temperature operation (60° C.) of a nitride semiconductor laser diode with a lasing wavelength of 506 nm, as shown in FIG. 6, a rapid deterioration took place within an initial several hours, which was followed by a large rate of deterioration. Examining the I-V characteristic of the nitride semiconductor laser diode found that while a normal rectification characteristics is shown at the initial stage as shown in FIG. 7, an abnormal spike 52 is observed at the rising portion of the current after a long period of operation, and the abnormality further expands during its operating life.

Based on the findings, the present inventor has carried out further investigations and discovered that, in a nitride semiconductor laser diode having a lasing wavelength of 500 nm or greater, life characteristics can be exponentially improved by controlling the concentration distribution of p-type impurity in a depth direction.

Figure 8:
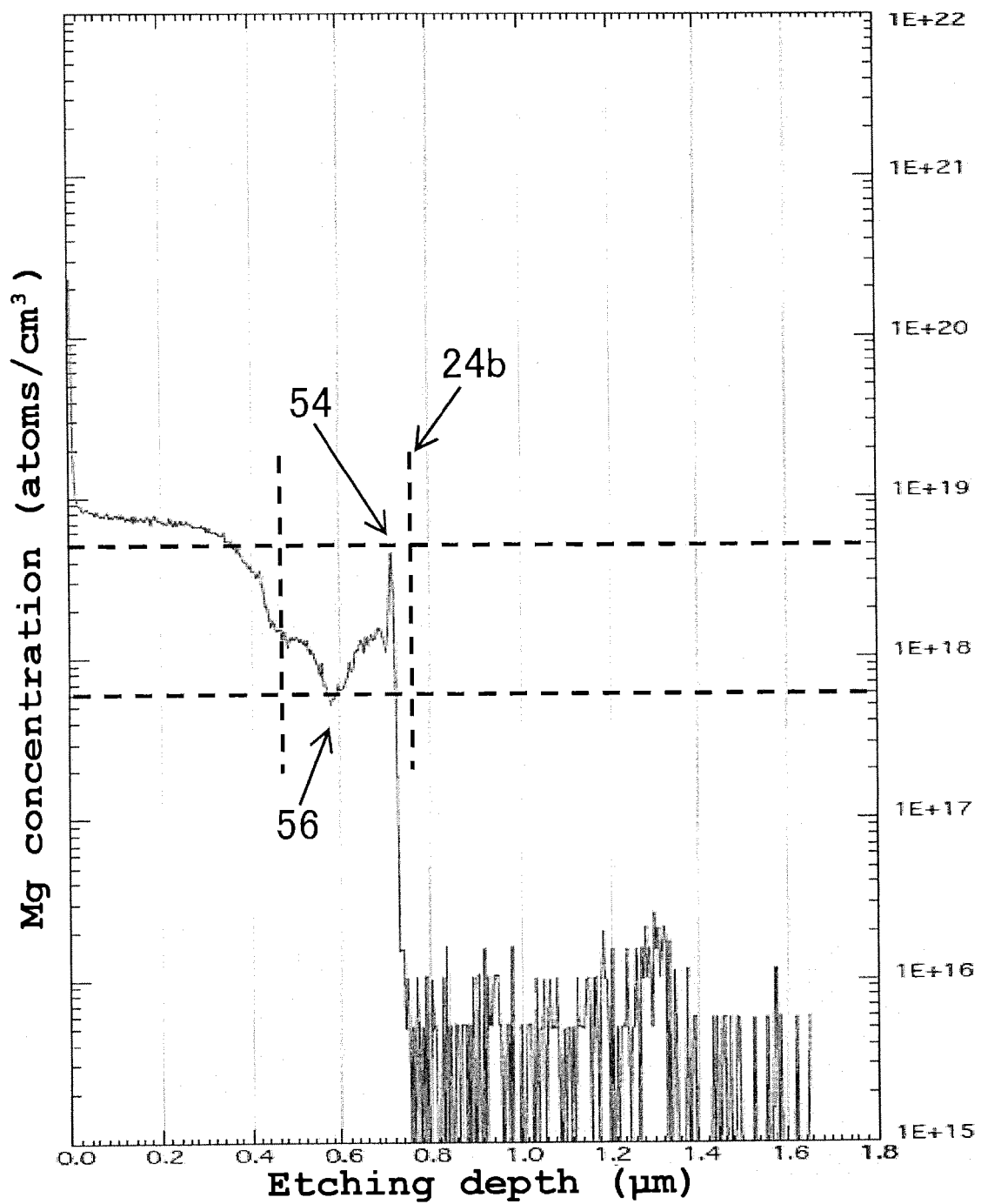
FIG. 8 is a diagram illustrating the concentration distribution of a p-type impurity in a depth direction in a nitride semiconductor laser diode of a comparative example.

FIG. 8 shows the depth profile of p-type impurity (Mg) concentration in the nitride semiconductor laser diode whose life characteristics is shown in FIG. 6, measured by secondary ion mass spectrometer (hereinafter simply referred as "SIMS"). The left end shown in FIG. 8 corresponds to the top surface of the p-side nitride semiconductor layer 8 and the location corresponding to the top end of the second well layer 24b is shown by an arrow at approximately the center of FIG. 8. The distance 300 nm from the top end of the second well layer 24b is shown by a dashed line. Within this range of distance, the holes can be efficiently supplied to the well layers 24b and 24a. The concentration distribution of the p-type impurity in this 300 nm range shows, from the well layer 24b toward the surface of the p-side nitride semiconductor layer 8, that the concentration of the p-type impurity started increasing once entered in the p-side nitride semiconductor layer 2 from the active layer 6, and reaches a local maximum at a position corresponding to a location in the Al-containing nitride semiconductor layer 26 (first p-type nitride semiconductor layer). The concentration of the p-type impurity decreases beyond the local maximum 54 and exhibits a local minimum 56 at a position corresponding to a location of the p-side optical guide layers 28a, 28b (second p-type nitride semiconductor layer).

Figure 9:
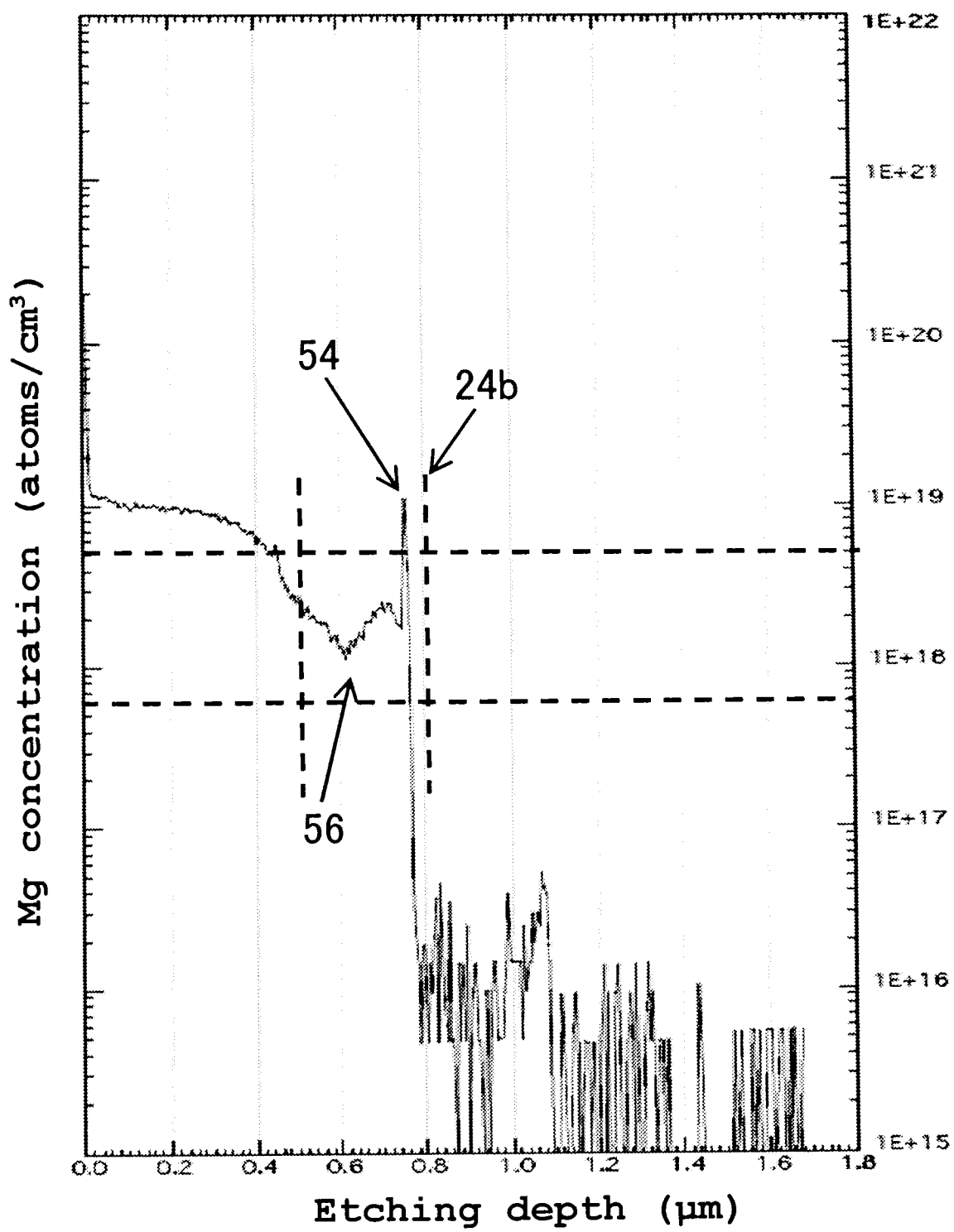
FIG. 9 is a diagram illustrating the concentration distribution of a p-type impurity in a depth direction in a nitride semiconductor laser diode of an example.
Figure 10:
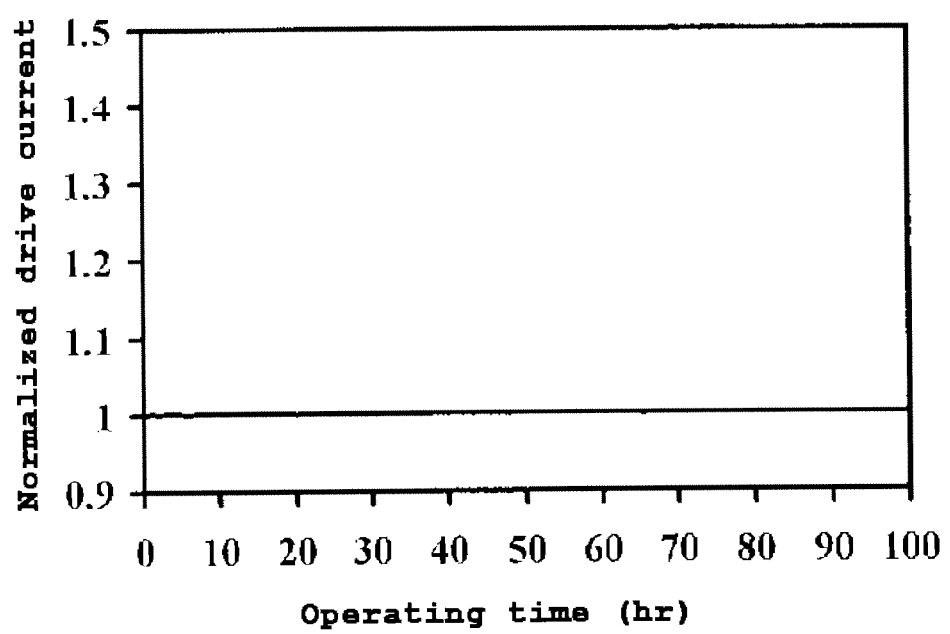
FIG. 10 is a diagram illustrating the result of a high-temperature life test of a nitride semiconductor laser diode of an example.

Increasing the local maximum 54 and the local minimum 56 of the p-type impurity concentration enables an exponential improvement in the life characteristics of the nitride semiconductor laser diodes. In the example shown in FIG. 9, while employing a same structure as in the nitride semiconductor laser diode with the depth profile of the p-type impurity concentration shown in FIG. 6, the p-type impurity concentration at the local maximum is set to $5 \times 10^{18}$ cm$^{-3}$ or greater and the p-type impurity concentration at the local maximum is set to $6 \times 10^{17}$ cm$^{-3}$ or greater. FIG. 10 shows the result of a high temperature operating life test at 60° C. of a nitride semiconductor laser diode with the depth profile of the p-type impurity concentration shown in FIG. 9. A change in the driving current is not observed in 100 hours, and the estimated operating life under high-temperature was about 50,000 hours. An estimated operating life is determined in such a way that the rate of change of the driving current is measured at predetermined driving conditions and based on the rate of change, and the duration of time where the driving current is estimated to reach 1.3 times of the initial stage.

Figure 11A:
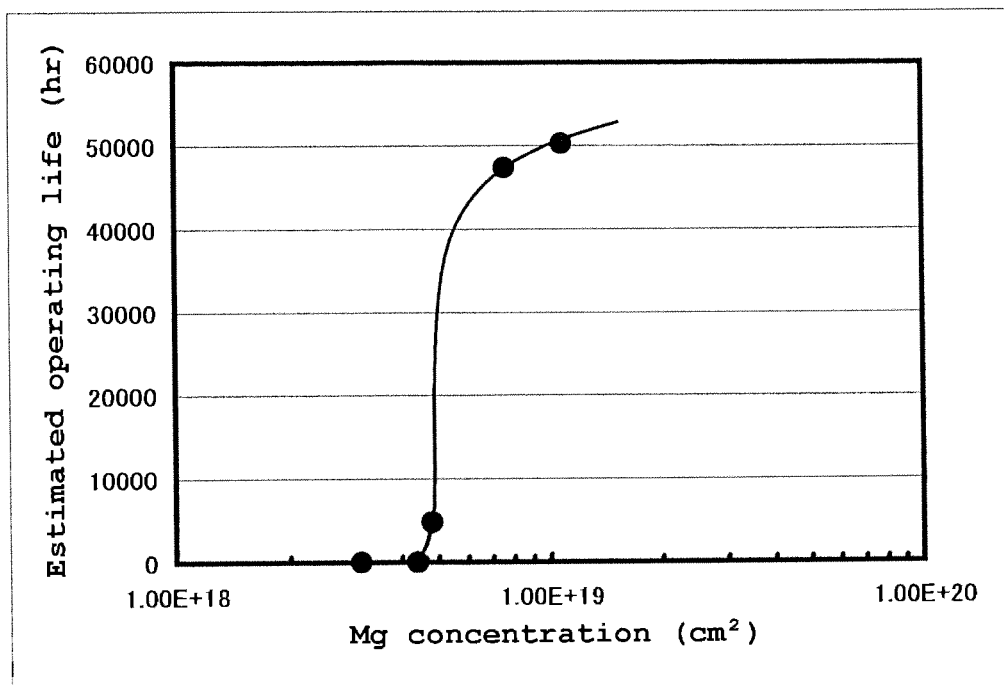
FIG. 11A is a diagram illustrating a relationship between the local maximum value in the concentration of a p-type impurity and the estimated operating life of a nitride semiconductor laser diode.
Figure 11B:
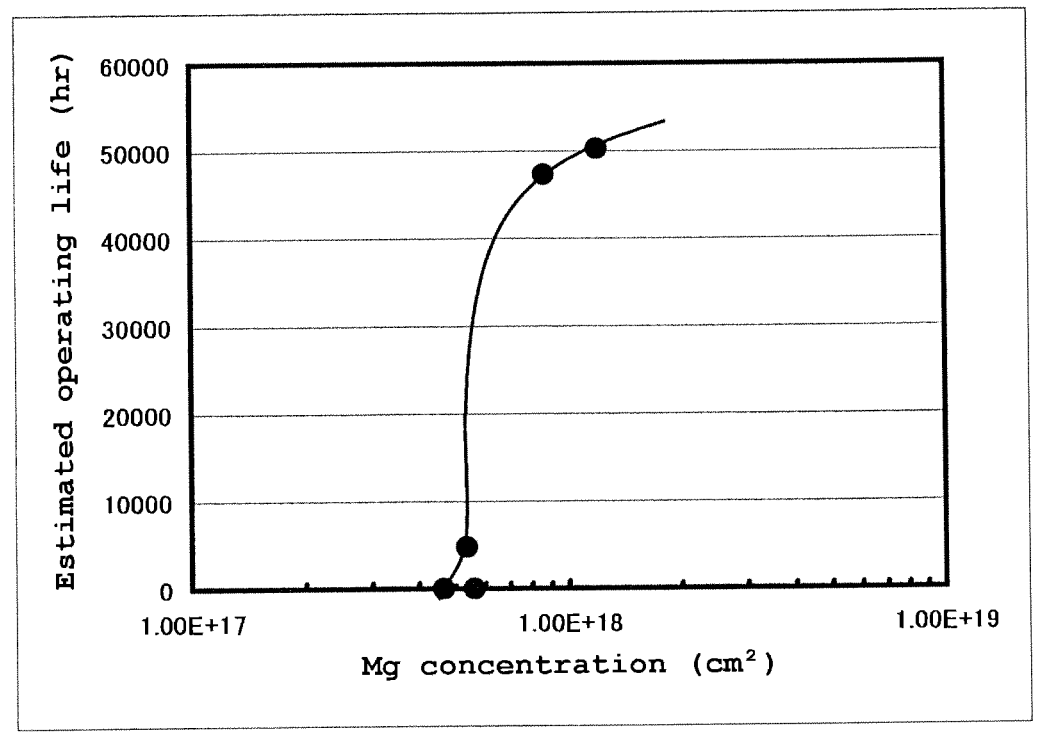
FIG. 11B is a diagram illustrating a relationship between the local minimum value in the concentration of a p-type impurity and the estimated operating life of a nitride semiconductor laser diode.

FIG. 11A and FIG. 11B show the relationship between the p-type impurity concentration and the estimated operating life at high temperature operation, at the local maximum 54 and local minimum 56 respectively. As shown in FIG. 11A and FIG. 11B, with the p-type impurity concentration at the local maximum of $5 \times 10^{13}$ cm$^{-3}$ or greater and the p-type impurity concentration at the local minimum of $6 \times 10^{17}$ cm$^{-3}$ or greater, an exponential improvement in the life characteristics of the nitride semiconductor laser diodes can be achieved.

The reason for the exponential improvement in the life characteristics of the nitride semiconductor laser diodes by controlling the p-type impurity concentration is thought as below. When the In content in the well layers 24a, 24b is increased to obtain the lasing wavelength of 500 nm or greater as described above, the dislocation density in the nitride semiconductor layer locates over the well layers 24a, 24b increases to at least $1 \times 10^6$ cm$^{-2}$. The crystal quality of the nitride semiconductor layer in the vicinity of the dislocations deteriorates, so that a partial inhibition to the generation of holes by the p-type impurity occurs with an increase of dislocation density. As a result, with a normal level of p-type impurity concentration, insufficient supply of holes to the InGaN well layers 24a, 24b occurs. For this reason, electrons diffuse into the p-side of the InGaN well layers 24a, 24b and nonradiative recombination occurs. Also, the In content in the InGaN well layers 24a, 24b increases, which results in an increase of dislocations from the InGaN well layers 24a, 24b. The dislocations affect the crystal quality of the p-side nitride semiconductor layer, and as a result, the life characteristics sharply deteriorate. However, maintaining the concentration of the p-type impurity greater than a predetermined value within the distance capable of efficiently supplying carriers to the well layers 24a, 24b (within 300 nm from the top of the well layer 24b) enables to secure the supply of holes to the InGaN well layers 24a, 24b. Light from the light emitting layer is strongly distributed in a region about 300 nm from the top of the light emitting layer. Therefore, once increase the concentration of the p-type impurity to greater than $5 \times 10^{18}$ cm$^{-3}$ and decrease the concentration of the p-type impurity to a range not less than $6 \times 10^{17}$ cm$^{-3}$ enables suppression of the absorption of the emission by the p-type impurity and also to suppression of increase of the threshold current. Accordingly, the life characteristics of the nitride semiconductor laser diode can be exponentially improved.

In order to obtain a practical nitride semiconductor laser diode, the estimated operating life at 60° C. 5 mW of 5000 hours or greater, preferably 10000 hours or greater is desirable.

In the present embodiment, the concentration of the p-type impurity in a range 300 nm from the top of the well layer 24b which is closer to the p-side nitride semiconductor layer 8 is controlled as described below: Dispose (a) a first p-type nitride semiconductor layer 26 made of a nitride semiconductor containing Al having a larger band gap than the well layers 24a, 24b with a concentration of the p-type impurity of $5 \times 10^{18}$ cm$^{-3}$ or greater and (b) second p-type nitride semiconductor layers 28a, 28b with a concentration of the p-type dopant within a range 300 nm from the top of the well layer 26b less than that in the first p-type nitride semiconductor layer 26 and greater than $6 \times 10^{17}$ cm$^{-3}$, in a range 300 nm from the top of the well layer 24b which is closest to the p-side nitride semiconductor layer 8. The site of highest concentration of the p-type impurity in the first p-type nitride semiconductor layer 26 is the local maximum of the p-type impurity in the concentration distribution in the depth direction. The site of the lowest concentration of the p-type impurity in the second p-type nitride semiconductor layers 28a, 28b is the local maximum of the p-type impurity in the concentration distribution in the depth direction. In the case where a nitride semiconductor layer in which the concentration of the p-type impurity is not distributed or the p-type impurity is added at a smaller concentration than $6 \times 10^{17}$ cm$^{-3}$ is inserted within a range of 300 nm from the top of the well layer 24b which is closest to the p-side nitride semiconductor layer 8, there may be no problem if the thickness of the nitride semiconductor layer is sufficiently small. For example, even if an undoped nitride semiconductor layer is inserted within 300 nm from the top of the well layer 24b, if the concentration of the p-type impurity measured by SIMS to be described later is not less than $6 \times 10^{17}$ cm$^{-3}$ within a range of 300 nm from the top of the well layer 24b, requirements of the present invention will be satisfied. Because it is considered that the thickness of the undoped layer is small to such degree where the concentration of the p-type impurity is not less than $6 \times 10^{17}$ cm$^{-3}$ under a SIMS measurement with a conditions exemplified in the present specification, with a diffusion of the p-type impurity from the layer adjacent to the undoped layer, the concentration of the p-type impurity in the undoped layer can be of sufficient to obtain the effect of the present invention.

The concentration of p-type impurity in each layer can be controlled by the flow rate of the raw material gas, growth temperature, pressure, V-III ratio, or the like of the p-type impurity in respective vapor-phase growth. For example, the higher the flow rate of the raw material gas of the p-type impurity and the growth temperature, the higher the concentration of the p-type impurity becomes. In the case where the nitride semiconductor contains In, segregation of In increasingly occur with higher growth temperature. Therefore, an excess rise of the growth temperature is unfavorable. Also, there is a tendency that, once starting to supply a raw material gas of p-type impurity at a constant rate during vapor growth of the nitride semiconductor, the concentration of the p-type impurity changes not in a step-wise manner but increases gradually with the growth of the nitride semiconductor. Also, even when a p-type impurity is doped in a layer at a constant concentration, an influence is exerted by the concentration of p-type impurity in the adjacent layer. For example, if the concentration of p-type impurity in the adjacent layer is high, a concentration gradient with higher concentration of p-type impurity in the vicinity of the adjacent layer will occur by diffusion of the p-type impurity from the adjacent layer.

(Local Maximum of Concentration of P-Type Impurity: First P-Type Nitride Semiconductor Layer 26)

The local maximum value of the concentration of p-type impurity in the first p-type nitride semiconductor layer 26 is sufficient to be $5 \times 10^{18}$ cm$^{-3}$ or greater, more preferably to be $7 \times 10^{18}$ cm$^{-3}$ or greater, and further preferably $1 \times 10^{19}$ cm$^{-3}$ or greater. The higher the p-type impurity concentration, the easier the holes to be injected in the well layers 24a, 24b. On the other hand, if the concentration of p-type impurity is too high, the crystal quality of the first p-type nitride semiconductor layer 26 deteriorates and absorption of light increases, which may result in an increase of threshold current. Therefore, the local maximum value of the concentration of p-type impurity in the first nitride semiconductor layer 26 is preferably to be $1 \times 10^{20}$ cm$^{-3}$ or less, more preferably to be $5 \times 10^{19}$ cm$^{-3}$ or less. The concentration of p-type impurity in the first p-type nitride semiconductor layer 26 may be constant in a depth direction or may have some sort of distribution in the first p-type nitride semiconductor layer 26. However, in the first p-type nitride semiconductor layer 26, the thickness of the region having the concentration of p-type impurity of $5 \times 10^{18}$ cm$^{-3}$ or greater is preferably 1 nm or greater, more preferably 5 nm or greater, and 20 nm or less, and more preferably 50 nm or less. This is because if the region is too thick, deterioration of crystal quality or absorption of light becomes a problem, and if the region is too thin, injection of holes in the well layers 24a, 24b becomes insufficient.

In the present embodiment, the first p-type nitride semiconductor layer 26 is made of a nitride semiconductor containing Al which has a larger band-gap than that of the well layers 24a, 24b. More preferably, it is made of a nitride semiconductor layer having larger band-gap than that of the barrier layer 22c. With this arrangement, the first p-type nitride semiconductor layer 26 functions as a carrier confinement layer confining the electrons in the active layer, thus, preferable. It can also function as a cap layer for preventing breakdown of the InGaN crystal in the active layer 6. The first p-type nitride semiconductor layer 26 may be a part of the p-side nitride semiconductor layer 8, or may be a part of the active layer 6.

The local maximum of the concentration of the p-type impurity in the first p-type nitride semiconductor layer 26 to be preferably within a distance of 300 nm from the top of the well layer 24b which is closer to the p-side nitride semiconductor layer 8, more preferably 150 nm or less and further preferably within 100 nm from the top of the well layer 24b. It is also preferable that the entire first p-type nitride semiconductor layer 26 is in a predetermined distance. With this arrangement, injection of the holes in the well layers 24a, 24b can be further facilitated. The distance from the top of the well layer 24b can be adjusted by the thickness of the final barrier layer 22c in the present embodiment. A layer other than the barrier layer 22c may be disposed between the well layer 24b and the first p-type nitride semiconductor layer 26. The local maximum of the concentration of p-type impurity may be formed not in the first p-type nitride semiconductor layer 26 but in the barrier layer 22c or the like, located beneath it.

(Local Minimum in P-Type Impurity Concentration: Second P-Side Nitride Semiconductor Layers 28a, 28b)

On the other hand, the local minimum value of $6 \times 10^{17}$ cm$^{-3}$ or greater in the p-type impurity concentration in the second p-type nitride semiconductor layers 28a, 28b is sufficient, but $8 \times 10^{17}$ cm$^{-3}$ or greater is more preferable, and $1 \times 10^{18}$ cm$^{-3}$ or greater is further preferable. The higher the p-type impurity concentration, the easier the holes to be injected in the well layers 24a, 24b. On the other hand, emission is relatively strongly distributed in a region about 300 nm from the top of the well layer 24b which is close to the p-side nitride semiconductor layer 8, so that if the concentration of p-type impurity in the second p-type nitride semiconductor layers 28a, 28b is too high, it may cause an increase of the threshold current. Particularly, in the present embodiment, the second p-type nitride semiconductor layers 28a, 28b function as an optical guide layer of a separate confinement heterostructure (SCH), so that effect of absorption of light in the second p-type nitride semiconductor layers 28a, 28b becomes particularly large. Thus, the local minimum value of the concentration of p-type impurity in the second p-type nitride semiconductor layers 28a, 28b is preferably ⅕ or less, more preferably ⅒ or less with respect to the local maximum value of the concentration of p-type impurity in the first p-type nitride semiconductor layer 26. Also, the local minimum value of the concentration of p-type impurity in the second p-type nitride semiconductor layers 28a, 28b is preferably not greater than $1 \times 10^{19}$ cm$^{-3}$, more preferably not greater than $5 \times 10^{18}$ cm$^{-3}$.

The concentration distribution of p-type impurity in the second p-type nitride semiconductor layers 28a, 28b is preferably such that after passing the local minimum described above, increases to $1 \times 10^{18}$ cm$^{-3}$ or greater in a range of 300 nm from the top of the well layer 22b. Absorption of light by the p-type impurity increases as the distance from the well layer 22b decreases. Accordingly, in a range of 300 nm from the top of the well layer 22b, arranging the concentration of p-type impurity to decrease in a portion near the top of the well layer 24b so as to suppress absorption of light and to increase in a portion away from the top of the well layer 24b so as to increase the concentration of p-type impurity of $1 \times 10^{18}$ cm$^{-3}$ or greater, injection of the holes in the well layers 24a, 24b can be further facilitated.

Such a distribution of p-type impurity can be realized by changing the flow rate of the row material gas of the p-type impurity during the vapor growth of the second p-type nitride semiconductor layers 28a, 28b. For example, it may be such that dividing the second p-type nitride semiconductor layers 28a, b in the first layer 28a and the second layer 28b, and supplying the raw material gas of the p-type impurity with a low flow rate or zero while growing the first layer 28a, and a high flow rate while growing the second layer 28b. Even if the flow rate of the raw material gas of the p-type impurity while growing the first layer 28a is zero, the raw material gas of the p-type impurity supplied during the growth of the first p-type nitride semiconductor layer 26 beneath it remains. Therefore, the concentration of p-type impurity in the first layer 28a gradually decreases as the distance from the interface with the first p-type nitride semiconductor layer 26 increases, and becomes the local minimum at the interface with the second layer 28b. Next, growing the second layer 28b with supplying the raw material gas of p-type impurity, the concentration of p-type impurity can be increased.

In the present embodiment, the second p-type nitride semiconductor layers 28a, b is preferably made of a nitride semiconductor which has a band-gap smaller than that of the first p-type nitride semiconductor layer 26 and the p-side cladding layer 32 to be grown next, and larger than the well layers 24a, b. For example, it can be formed with a nitride semiconductor containing Al less than that in the first p-type nitride semiconductor layer 26 and the p-side cladding layer 32. With this arrangement, the second p-type nitride semiconductor layers 28a, b can serve as the p-side optical guide layer. The second p-type nitride semiconductor layers 28a, b may have other functions such as a cladding layer in an element in which a optical guide layer is omitted.

The local minimum of the concentration of the p-type impurity in the second p-type nitride semiconductor layers 28a, b to be preferably within a distance of 300 nm from the top of the well layer 24b which is closer to the p-side nitride semiconductor layer 8, more preferably 250 nm or less and further preferably within 100 nm from the top of the well layer 24b. With this arrangement, injection of the holes in the well layers 24a, b can be further facilitated. The distance from the top of the well layer 24b can be adjusted by the thickness of the final barrier layer 22c, first p-type nitride semiconductor layer 26, and the first layer 28a of the second p-type nitride semiconductor layer, in the present embodiment. Also, a layer other than those layers described above may be interposed to adjust the distance. Also, the local minimum of the concentration of p-type impurity may be formed not in the second p-type nitride semiconductor layers 28a, b but in the first p-type nitride semiconductor layer 26 beneath those.

The longer the lasing wavelength of the nitride semiconductor laser diode, the higher the density of dislocations generated in the active layer 6. For this reason, the local maximum value of the concentration of p-type impurity in the first nitride semiconductor layer 26 and the local minimum value in the second p-type nitride semiconductor layers 28a, b are preferably set to a higher values as the lasing wavelength increases. For example, in the case where the lasing wavelength is 560 nm, it is preferable to set the concentration of the p-type impurity with the local maximum value of about $5 \times 10^{19}$ cm$^{-3}$ and the local minimum value of about $5 \times 10^{18}$ cm$^{-3}$. If the concentration of p-type impurity exceed those values, the crystal quality of the p-side nitride semiconductor layer deteriorates and effect of absorption of emission increases. Accordingly, in the nitride semiconductor laser diode according to the present invention, the lasing wavelength is desirably set to 560 nm or less.

In the present invention, the depth distribution of the concentration of p-type impurity can be measured by SIMS (ATOMIKA SIMS 4500). For example, with the primary ion species of O2+, the accelerating voltage of 2 kV, the electric current of 110 nA, and the raster region (etched region of the sample) of 120 m², the primary ion is irradiated perpendicularly to the sample, and the measuring region (obtaining the data) is set to 30 m² to detect the secondary ion, thus, the measurement can be carried out. In order to determine the value of the concentration of the p-type impurity based on a SIMS measurement, a standard sample of a nitride semiconductor layer of a known p-type impurity concentration is measured by SIMS and use the detected amount of the secondary ion as a standard. A standard sample can be made by, for example, ion-injecting a p-type impurity in a nitride semiconductor layer. The dislocation density in the p-side nitride semiconductor layer can be measured by observing the upper surface of the p-side nitride semiconductor layer with cathode luminescence (CL) or by observing a cross-section under a transmission electron microscope (TEM).

Now, each component of the nitride semiconductor laser diode 1 of the present embodiment will be described in detail below.

(Substrate 2)

The substrate 2 is preferably made of a nitride semiconductor greater preferably made of GaN. A substrate made of a nitride semiconductor has higher heat conductivity than that of sapphire, so that heat dissipation efficiency can be improved and defects such as dislocations can be reduced, thus good crystal quality can be obtained. With a lower dislocation density of the substrate 2, the state of surface of the well layers 24a, 24b can be improved and the life characteristics can be improved. Although a nitride semiconductor laser diode employing an InGaN light emitting layer exhibits a more gradual decline in life characteristics caused by dislocations compared to other material-systems, it still has dependency on dislocations. With a lower dislocation density of the substrate 2, a higher ESD tolerance can be achieved. The dislocation density of the substrate 2 is preferably $1 \times 10^7$ cm$^{-2}$ or less, more preferably $5 \times 10^6$ cm$^{-2}$ or less, and further preferably $5 \times 10^5$ cm$^{-2}$ or less. The dislocation density of the substrate 2 is considered as the dislocation density on the principal surface on which the nitride semiconductor layer to be grown.

Also, the dislocation density of the substrate 2 is preferably the same or less than the dislocation density occurring in the active layer 6. When the dislocation density of the substrate 2 is the same or less than the dislocation density occurring in the active layer 6, the distribution of dislocations in the entire element takes a characteristic shape. That is, it takes a structure having a low dislocation density from the substrate to the active layer and a high dislocation density above the active layer. In such a structure, introduction of dislocations enables release of distortion loaded from the under-layer to the active layer (well layer), so that reduction in the light emitting efficiency caused by the distortion (for example, piezoelectric polarization etc.) can be suppressed, and is thus preferable.

The substrate 2 made by various methods can be used. For example, the substrate may be obtained such a manner that, after growing a thick layer of nitride semiconductor layer on a foreign substrate such as sapphire by using hydride vapor phase epitaxy method (HVPE method) and then removing the foreign substrate to obtain the substrate made of nitride semiconductor. Also, at the time of growing a nitride semiconductor layer on a foreign substrate such as sapphire, dislocation density may be reduced by using a known lateral growth method. A wafer cut out from an ingot of a nitride semiconductor crystal grown by using an appropriate seed crystal may be used as the substrate 2.

Also, the laser diode is preferably grown on the C-plane of the substrate made of nitride semiconductor. Growing the laser diode on the C-plane of nitride semiconductor has advantages such that the cleavage plane (m-plane) is easily developed, the C-plane is chemically stable which facilitates processing and has resistance to etching to some degree sufficient for processing in the laser steps.

(N-Side Nitride Semiconductor Layer)

Figure 12:
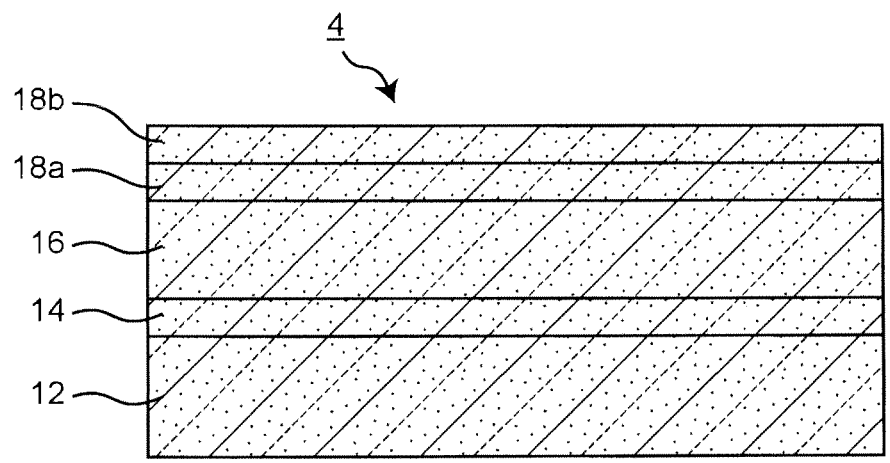
FIG. 12 is a schematic cross-sectional view illustrating a layer structure of an n-side nitride semiconductor layer.

The layer structure of the n-side nitride semiconductor layer 4 used in the present embodiment is shown in FIG. 12. Of the layers described below, the layers other than the n-side cladding layer 16 can be omitted according to the structure of the element.

First, a first n-side nitride semiconductor layer 12 made of a nitride semiconductor having a thermal expansion coefficient smaller than that of the nitride semiconductor constituting the substrate and doped with an n-type impurity such as Si is grown on the substrate 2 made of a nitride semiconductor. The first n-side nitride semiconductor layer 12 serves as the under-layer. The first n-side nitride semiconductor layer 12 is made of a nitride semiconductor containing Al, preferably made of AlGaN. Forming the first n-side nitride semiconductor layer 12 with a material having a thermal expansion coefficient smaller than that of the nitride semiconductor constituting the substrate enables application of compression strain on the first n-side nitride semiconductor layer 12 which enables prevention of generation of microscopic cracks. The first n-side nitride semiconductor layer 12 is preferably made with a thickness of 0.5 to 5 m.

On the first n-side nitride semiconductor layer 12, a second n-side nitride semiconductor layer 14, made of a nitride semiconductor containing In, preferably made of InGaN, and doped with an n-type impurity is grown. The second n-side nitride semiconductor layer 14 can be served as a crack prevention layer. A nitride semiconductor containing In has relatively flexible crystal, which enables relaxing of the distortion applied on the nitride semiconductor layer grown on it, so that occurrence of cracks can be prevented. The second n-side nitride semiconductor layer 14 is preferably formed with a thickness of 50 to 200 nm.

On the second n-side nitride semiconductor layer 14, a third n-side nitride semiconductor layer 16 made of a nitride semiconductor containing Al, preferably made of AlGaN, and doped with a n-type impurity is grown. The third n-side nitride semiconductor layer 16 can serve as the n-side cladding layer. The third n-side nitride semiconductor layer 16 is constituted with a nitride semiconductor having a band gap at least larger than that of the barrier layers 22a, 22b, 22c. The third n-side nitride semiconductor layer 16 may either be a single layer or a multilayer. Also, it may be a multilayer having a superlattice structure. The third n-side nitride semiconductor layer 16 is preferably made with a thickness of 0.5 to 2.0 m.

On the third n-side nitride semiconductor layer 16, fourth n-side nitride semiconductor layers 18a, 18b each having a band-gap smaller than that of the third n-side nitride semiconductor layer 16 and larger than that of the well layers 24a, 24b are formed. The fourth n-type nitride semiconductor layers 18a, 18b can serve as the n-side optical guide layer. The fourth n-side nitride semiconductor layers 18a, 18b are preferably made of GaN or InGaN. The fourth n-side nitride semiconductor layers 18a, 18b sufficiently supply electrons to the active layer 6 while suppressing absorption of light. Therefore, it is preferable to divide into (i) a fourth n-side nitride semiconductor layer 18a away from the active layer and grown by being doped with an n-type impurity and (ii) a fourth n-side nitride semiconductor layer 18b close to the active layer 6 and grown without being grown by an n-type impurity. The fourth n-side nitride semiconductor layers 18a, 18b are preferably formed with a total thickness of 200 to 300 nm.

(Active Layer 6)

The active layer 6 is sufficient to have a light emitting layer including $In_xAl_yGa_{1-x-y}N$ (0<x<1, 0 y<1, 0<x+y<1) and the active layer having the multiquantum well structure shown in FIG. 1 or other, such as an active layer having a single quantum well structure, an active layer made of a thin single light emitting layer, or the like can be used. In the quantum well structure, the well layers 24a, 24b serve as the light emitting layer. The light emitting layer is sufficient to contain $In_xAl_yGa_{1-x-y}N$ (0<x<1, 0 y<1, 0<x+y<1), but more preferably made of InGaN. In the present invention, the term "light emitting layer" refers to a layer in which radiative recombination of holes and electrons occurs.

The emission wavelength of the light emitting layer can be adjusted by the In content, as described more specifically in examples. When the well layer has a high In content, a well-cap layer (not shown) is preferably provided over each well layer to prevent the deterioration of the well layer. It is preferable that the well-cap layer has a thickness in a range of 1-5 nm, and made of AlInGaN with the Al content of 0-50%, more preferably made of AlGaN with the Al content of 0-30%. The well-cap layer is formed between the well layer and the barrier layer.

The light emitting layer of the active layer 6 with a smaller thickness is capable of reducing the threshold current and facilitating the releasing of the lattice constant mismatching with the barrier layer, but with an excessively small thickness fails to provide a sufficient carrier confinement. For this reason, the thickness of the light emitting layer is preferably 1.0 nm or greater, more preferably 2.0 nm or greater and preferably 5.0 nm or less, more preferably 4.0 nm or less. The light emitting layer of the active layer 6 may be doped with or not doped with an n-type impurity. However, the crystal quality of a nitride semiconductor containing In tends to deteriorate with a increase of the n-type impurity concentration, so that the n-type impurity concentration is preferably kept low to obtain the light emitting layer with good crystal quality.

Forming the active layer with a multiquantum well structure enables improvement of the output power, reduction of the lasing threshold value, or the like. When the active layer 6 is made of a multiquantum well structure, the first and the last layers may either be a well layer or a barrier layer as long as well layers and barrier layers are alternately stacked. However, as in the present embodiment, the outermost layer is preferably a barrier layer. That is, in a multiquantum well structure, the barrier layer interposed in the well layers is not specifically limited to be a single layer (well layer/barrier layer/well layer) and two or greater barrier layers, such as in "well layer/barrier layer (1)/barrier layer (2)/well layer", a plurality of barrier layers with different compositions and amounts of impurity may be provided.

The barrier layers 22a, 22b, 22c used in the active layer 6 having a quantum well structure are not specifically limited, but a nitride semiconductor having a lower In content than in the well layers 24a, 24b, or GaN, a nitride semiconductor containing Al, or the like, can be used. It is more preferable to include InGaN, GaN or AlGaN. The thickness and composition of the barrier layers 22a, 22b, and 22c are not necessarily to be the same in the quantum well structure. Thus, in the present embodiment, the thickness is increased in the order of the barrier layer 22a closest to the n-side>the barrier layer 22c closest to the p-side>the barrier layer 22b interposed therebetween. Also, the n-type impurity is only doped in the barrier layer 22a which is closest to the n-side, and other barrier layers 22b, 22c and the well layers 24a, 24b are grown without doped with an n-type impurity.

In the present embodiment, the number of the well layers 24a, 24b is set to two and the number of the barrier layers 22a, 22b, 22c is set to three, but the present invention is not limited to those. For example, the number of the well layers 24a, 24b may not be two but may be increased to such as three layers or four layers. Generally, the longer the lasing wavelength, the smaller the thickness of the well layer needed to be to prevent occurrence of dislocations in the active layer 6. In the present invention, generation of dislocations in the active layer 6 is allowed. Therefore, there is no need to reduce the thickness of the well layer to the degree that results in insufficient carrier confinement as the entire active layer 6. However, with increasing the number of the well layers, carrier confinement as the entire active layer 6 can be achieved even with using the well layers with much smaller thickness. Accordingly, excess generation of dislocations in the active layer 6 can be avoided. In the case of a nitride semiconductor laser diode with the lasing wavelength of 500 nm or greater, the threshold current decreases with the number of the well layers three layers or four layers, compared to the case with two layers.

The lasing wavelength of the active layer 6 according to the present invention is sufficient to be 500 nm or greater, but an excessively long wavelength is not preferable for it results in excessively high dislocation density generated in the active layer 6. As shown in FIG. 5, when the lasing wavelength of the active layer 6 is 560 nm, the density of dislocations generated in the active layer 6 may be about $1 \times 10^7$ $cm^{-2}$. The dislocation density of more than the above is not preferable because the necessary amount of the concentration of the p-type impurity becomes too high. For this reason, the lasing wavelength of the active layer 6 is set to 560 nm or less so that the dislocation density generated in the active layer 6 to be $1 \times 10^7$ $cm^{-2}$.

(P-Side Nitride Semiconductor Layer 8)

As the p-side nitride semiconductor layer 8, an Al-containing nitride semiconductor layer 26 (first p-type nitride semiconductor layer), a p-side optical guide layer 28a, 28b (second p-type nitride semiconductor layer), a p-side cladding layer 32 (third p-type nitride semiconductor layer), and a p-side contact layer 34 (fourth p-type nitride semiconductor layer) are stacked. The layers other than the p-side cladding layer 32 can be omitted according to the element. The p-side nitride semiconductor layer 8 is needed to have a band-gap wider than that of the active layer 6 at least at a portion being in contact with the active layer 6, and for this reason, a composition containing Al is preferable. Each layer may be grown while being doped with a p-type impurity to obtain the p-type, or a p-type impurity is diffused from the adjacent other layers to obtain the p-type. For the p-type impurity, Be, Zn, Cd, or the like can be used as other than Mg.

The Al-containing nitride semiconductor layer 26 is made of a p-type nitride semiconductor having an Al mixed crystal ratio higher than that of the p-side cladding layer 32, and preferably contains $Al_xGa_{1-x}N$ (0.1<x<0.5). Also, a p-type impurity such as Mg is doped at a concentration of $5 \times 10^{18}$ $cm^{-3}$ or greater. With this arrangement, the Al-containing nitride semiconductor layer 26 is able to sufficiently confine electrons in the active layer 6, so that the threshold value of the laser can be reduced. Also, the Al-containing nitride semiconductor layer 26 is sufficiently grown as a thin film with a thickness of about 3 to 50 nm, more preferably about 3 to 20 nm. Such a thin film can be grown at a lower temperature than that of the p-side optical guide layer 28a, 28b and the p-side cladding layer 32. Therefore, with forming the Al-containing nitride semiconductor layer 26, deterioration of the active layer 6 containing In can be suppressed compared to the case where the p-side optical guide layers 28a, 28b and the like are directly disposed on the active layer 6.

The Al-containing nitride semiconductor layer 26 also diffusion supplying p-type impurity to the barrier layer 22c which is grown undoped. They both work together to protect the well layers 24a, 24b from deterioration and to enhance efficiency in injecting holes in the well layers 24a, 24b. That is, as the last layer of the active layer 6, an undoped barrier layer 22c is disposed with a thickness larger than that of the other barrier layers, and thereon, a nitride semiconductor layer 26 having a small thickness and containing an undoped p-type $Al_xGa_{1-x}N$ ($0.1<x<0.5$) is grown at a low temperature. Accordingly, the active layer 6 containing In can be protected from deterioration and the p-type impurity such as Mg can be diffused from the p-type $Al_xGa_{1-x}N$ layer to the undoped barrier layer 22c, so that the p-type impurity such as Mg diffuse from the p-type $Al_xGa_{1-x}N$ layer to the undoped barrier layer 22c, injection efficiency of holes in the active layer 6 can be improved.

The Al-containing nitride semiconductor layer 26 is to serve as an electron confinement layer, so that is disposed between the active layer 6 and the cladding layer 32. In the case where the optical guide layers 28a, 28b are further provided, the Al-containing nitride semiconductor layer 26 is preferably disposed between the optical guide layers 28a, 28b and the active layer 6. Forming the Al-containing nitride semiconductor layer 26 within 300 nm, more preferably within 200 nm, and further preferably within 100 nm from the top of the well layer 24b which is closest to the p-side nitride semiconductor layer 8 allows the Al-containing nitride semiconductor layer 26 to serve as an electron confinement layer and enables efficient supply of the holes. The closer the Al-containing nitride semiconductor layer 26 to the active layer 6, the more efficient the effect of carrier confinement. Moreover, in most cases, the laser element another layer is not specifically needed between the Al-containing nitride semiconductor layer 26 and the active layer 6, so that generally it is most preferable to provide an Al-containing nitride semiconductor layer 26 in contact with the active layer 6. Also, it is possible to provide a buffer layer therebetween.

The p-side light guiding layers 28a, 28b (second p-type nitride semiconductor layer) are preferably made of a p-type nitride semiconductor layer 26 containing Al and a nitride semiconductor which has a band-gap smaller than that of the p-type cladding layer 32 to be grown next, and larger than that of the well layers 24a, 24b. For example, it can be formed with a nitride semiconductor containing Al less than that in the p-type nitride semiconductor layer 26 containing Al and the p-side cladding layer 32. In order to sufficiently supply holes to the active layer 6 while preventing absorption of light, the p-side optical guide layer 28a, 28b are preferably divided into (i) a first p-side optical guide layer 28a disposed closer to the active layer 6 and grown without being doped with a p-type impurity, and (ii) a second optical guide layer 28b disposed away from the active layer 6 and grown while being doped with a p-type impurity.

The p-side cladding layer 32 (third p-type nitride semiconductor layer) preferably made with a superlattice structure including an Al-containing nitride semiconductor layer, preferably $Al_xGa_{1-x}N$ ($0<x<1$), further preferably made with a superlattice structure in which AlGaN of different Al composition are stacked. Providing the p-side cladding layer 32 with a superlattice structure allows increase of the Al mixed crystal ratio of the entire cladding layer which enables decrease of the refractive index of the cladding layer, and further increase of the band gap energy. Thus, it is significantly advantageous for decreasing the threshold. Further, with a superlattice structure, pits and cracks occurring in the cladding layer can be reduced compared to that without a superlattice structure, so that occurrence of short circuit can also be reduced. The band gap of the p-side cladding layer 32 (third p-type nitride semiconductor layer) is preferably larger than that of the p-side optical guide layer 28a, 28b (second p-type nitride semiconductor layer) and smaller than that of the first p-type nitride semiconductor layer 26. The band gap of the p-side cladding layer 32 (third p-type nitride semiconductor layer) having a superlattice structure made by stacking an A layer and a B layer can be considered an average of the A layer and the B layer. The p-type impurity concentration of the p-side cladding layer 32 (third p-type nitride semiconductor layer) is preferably higher than that of the p-side optical guide layers 28a, 28b (second p-type nitride semiconductor layer) and lower than that of the p-side contact layer 34 (fourth p-type nitride semiconductor layer). The higher p-type impurity concentration than that of the p-side optical guide layers 28a, 28b (second p-type nitride semiconductor layer) enables aid of the supply of holes and the lower p-type impurity concentration than that of the p-side contact layer 34 (fourth p-type nitride semiconductor layer) enables suppression of increasing of the threshold current caused by deterioration of crystal quality. The impurity concentration of the p-side cladding layer 32 (third p-type nitride semiconductor layer) having a superlattice structure made by stacking an A layer and a B layer can be considered an average of the A layer and the B layer.

The p-side contact layer 34 (fourth p-type nitride semiconductor layer) can be constituted with a p-type nitride semiconductor, and preferably, GaN doped with Mg is employed to obtain good ohmic contact with the p-side electrode 38. The p-side contact layer 34 is to form an electrode, so that preferably formed with a high carrier concentration of $5 \times 10^{19}/cm^3$ or greater.

In the laser diode according to the present embodiment, after forming a ridge 36 by etching a part of the optical guide layers 28a, b, the side surfaces of the ridge 36 are covered with an insulating embedded layer such as $SiO_2$, and an insulating protective film 48 such as $SiO_2$ is further provided. For the protective film 48, a semi-insulating, i-type nitride semiconductor, a nitride semiconductor having an opposite conductivity to that of the ridge portion, or the like, can also be used.

Figure 13:
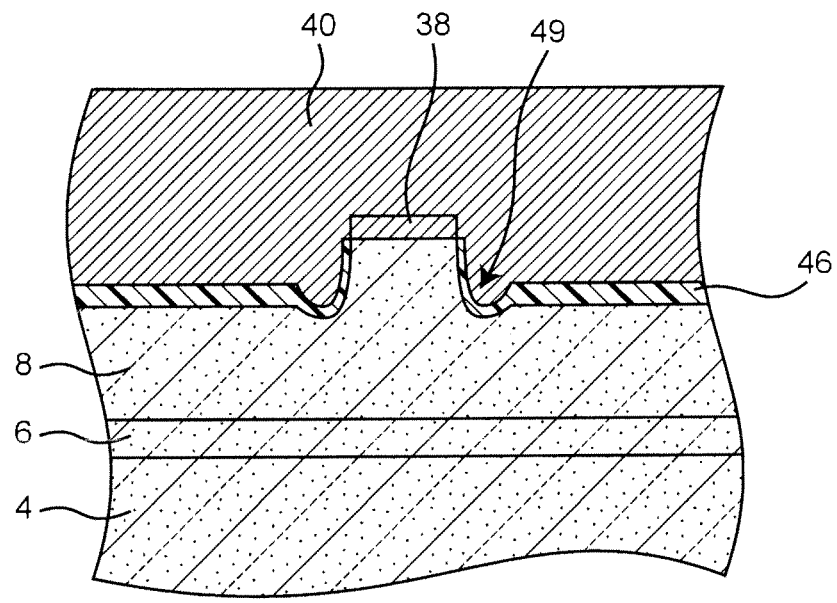
FIG. 13 is a schematic cross-sectional view illustrating a ridge structure disposed on a p-side nitride semiconductor layer.

At the time of providing the ridge 36, as shown in FIG. 13, a groove 49 in parallel to the ridge is preferably formed at the both sides of the bottom portion of the ridge 36. When the In content of the well layer is high, the difference in the refractive indices to AlGaN which is typically used as the p-side cladding layer 32 decreases, so that a sufficient light confinement index is difficult to obtain. For this reason, providing a groove 49 which is continuous in the lengthwise direction of the resonator at the both sides of the ridge 36 enables sufficient optical confinement even in the case where the In content of the well layer is high.

The laser diode according to the present invention is not limited to a refractive index waveguide type having a ridge structure described above and various structures can be employed such as a BH structure in which the side surfaces of the ridge are embedded by re-growth or a structure provided with a current confinement layer. The laser diode according to the present invention is made of a nitride semiconductor represented by $Al_xIn_yGa_{1-x-y}N$ ($0 \le x \le 1$, $0 \le y<1$, $0<x+y<1$), which is preferably a nitride semiconductor of a hexagonal crystal system. With a hexagonal crystal system, other elements may be contained in a Group III element or a Group V element at a small amount which does not reduce the crystal quality.

According to the present invention, a nitride semiconductor laser diode with a lasing wavelength of 500 nm and has excellent emission efficiency and life characteristics can be realized. With the green nitride semiconductor laser diode of the present invention, a full-color display can be realized by a combination of a conventional blue nitride semiconductor laser diode and a conventional red semiconductor laser diode. For example, combining the nitride semiconductor laser diode having a lasing wavelength of 500 to 560 nm constituted according to the present invention with a nitride semiconductor laser diode having a lasing wavelength of 440 to 480 nm and a semiconductor laser diode having a lasing wavelength of 600 to 660 nm, a full-color display apparatus using semiconductor lasers can be obtained.

EXAMPLES

Example 1

A nitride semiconductor laser having a structure shown in FIG. 1 is manufactured as described below.
(N-Side Nitride Semiconductor Layer 4)

First, a gallium nitride substrate 2, which has a C-plane as a principal surface, with dislocation density of about $5 \times 10^5$ cm$^{-2}$ is prepared. Then, an n-type $Al_{0.03}Ga_{0.97}N$ layer 12 doped with Si at $3 \times 10^{18}$ cm$^3$ is grown to a thickness of 2 m (first n-side nitride semiconductor layer) by using TMG (trimethyl gallium, TMA (trimethyl aluminum), SiH4 (silane), and ammonia at 1140° C. with hydrogen as carrier gas by using MOCVD on the gallium nitride substrate 2. Following that, at the temperature of 930° C. and using TMI (trimethyl indium), an n-type $In_{0.06}Ga_{0.94}N$ layer 14 doped with Si at $4 \times 10^{15}$ cm$^3$ is grown to a thickness of 0.15 m (second n-side nitride semiconductor layer). Next, at the temperature of 990° C., an n-type $Al_{0.09}Ga_{0.91}N$ layer 16 doped with Si at $2 \times 10^{18}$ cm$^3$ is grown to a thickness of 1 m (third n-side nitride semiconductor layer 16). This layer can also be made with a multilayer structure such as $Al_xGa_{1-x}N/Al_yGa_{1-y}N$ (0 x 1, 0 y 1) with an appropriate thickness ratio with an average Al-content of 9%. Next, TMA is stopped and at the temperature of 990° C., an n-type GaN layer 18a doped with Si at $1 \times 10^{18}$ cm$^3$ and an undoped n-type GaN layer 18b are respectively grown to a thickness of 0.15 m (fourth n-side nitride semiconductor layer 18a, 18b). The undoped GaN layer 18b may be doped with an n-type impurity.
(Active Layer 6)

Next, an active layer 6 is grown as follows. The carrier gas is changed to nitrogen and at the temperature of 925° C., a barrier layer 22a of $In_{0.04}Ga_{0.96}N$ doped with Si of $2 \times 10^{18}$/cm$^3$ and an undoped GaN layer (not shown) are grown to a thickness of 210 nm and 1 nm respectively. Next, at the temperature of 780° C., after growing a well layer 24a of undoped $In_{0.23}Ga_{0.77}N$ to a thickness of 3 nm, a well-cap layer (not shown) of undoped GaN is grown to a thickness of 1 nm. Then, the temperature is raised to 925° C., a barrier layer 22b of undoped GaN is grown to a thickness of 14 nm. Next, at the temperature of 780° C., a well layer 24b of undoped $In_{0.23}Ga_{0.77}N$ is again grown to a thickness of 3 nm, and thereafter, a well-cap layer (not shown) of undoped GaN is grown to a thickness of 1 nm. Then, the temperature is raised to 925° C., a barrier layer 22c of undoped $In_{0.04}Ga_{0.96}N$ is grown to a thickness of 70 nm. Thus, an active layer having a multiquantum well structure (MQW) is formed.

(P-Side Nitride Semiconductor Layer 8)

Next, the temperature is raised to 990° C. and the carrier gas is changed from nitrogen to hydrogen, and using Cp$_2$Mg (bis-cyclopentadienyl magnesium) as a Mg impurity, a p-type $Al_{0.2}Ga_{0.8}N$ layer 26 (first p-type nitride semiconductor layer) doped with Mg of $1 \times 10^{19}$/cm$^3$ is grown to a thickness of 10 nm. In the layer 26, the Al composition distribution in the growth direction is within 0 to 20%. Then, at 990° C. an undoped p-type $Al_{0.03}Ga_{0.97}N$ layer 28a and a p-type $Al_{0.003}Ga_{0.97}N$ layer 28b doped with Mg of $3 \times 10^{18}$/cm$^3$ are respectively grown to a thickness of 0.15 m (second p-type nitride semiconductor layer). In the undoped layer 28a, Mg is not intentionally doped. However, Mg used in the immediately preceding growth of the layer 26 remains in the MOCVD reaction chamber and is incorporated in the layer 28a during the growth, and results in the Mg concentration in the layer 28a of $1.2 \times 10^{18}$ cm$^{-3}$ or greater. The layer 28a may be intentionally doped with Mg, or the Al composition thereof may be 0 to 3%. Next, a 2.5 nm thickness of Mg-doped $Al_{0.12}Ga_{0.94}N$ layer, a 2.5 nm thickness of undoped $Al_{0.92}Ga_{0.88}N$ layer are alternately grown, so that the third layer 32 (third p-type nitride semiconductor layer) of a total thickness of 0.45 m is grown. The average Mg concentration in the layer 32 is about $1 \times 10^{19}$ cm$^{-3}$. Finally, at 990° C., a p-type GaN layer 32 doped with Mg of $1 \times 10^{20}$/cm$^3$ is grown to a thickness of 15 nm on the layer 26.

Next, the wafer on which the nitride semiconductor has grown is taken out of the reaction vessel, and a mask made of SiO$_2$ is formed on the surface of the uppermost layer of the p-type GaN layer 32. Then using the mask, 3 m of etching is carried out on the nitride semiconductor layer and a stripe structure with a length of 600 m (corresponding to the length of resonator) is formed. This portion serves as the resonator cavity of the laser element. The length of the resonator is preferably in a range of 200 m to 5000 m. Next, a mask with a stripe shape made of SiO2 is formed on the p-type GaN layer 32, and using the mask, etching is carrier out on the p-type GaN layer 32 by way of RIE (Reactive Ion Etching). With this, the ridge portion 36 which is a stripe-shaped waveguide region is formed with a width of 2 m. At this time, the etching conditions (pressure, temperature) are adjusted so that, as shown in FIG. 13, the side portions 49 of the ridge is etched 30 nm deeper than the peripheral portions of the ridge and the side walls of the ridge portion 36 are formed at an angle of 75 degrees with respect to the p-type GaN layer 32.

Next, the entire upper surface of the wafer is covered with a photoresist and etching is carried out on the photoresist until the SiO$_2$ on the ridge portion 36 is exposed. Then, a mask of a photoresist is again applied on the regions corresponding to the end surfaces of the resonator when divided into chips, and etching is carried out on the SiO$_2$ on the ridge 36 except for the area around the end surfaces and the p-type GaN layer is exposed. Next, a p-electrode 38 made of Ni(10 nm)/Au(100 nm)/Pt(100 nm) is formed over the entire wafer by way of sputtering. Thereafter, the entire photoresist is removed so that the p-electrode 38 only remain at the portions of the stripe-shaped ridge 36 where the SiO$_2$ has been removed. Then, ohmic annealing is carried out at 600° C.

Next, an embedded layer 46 made of a Si oxide (SiO$_2$, 200 nm) is disposed by way of sputtering. At this time, the ridge portion 36 has a tapered shape and the cross-sectional area with respect to the surface of the wafer of the side walls of the ridge portion 36 is smaller than other regions, so that the thickness of the embedded layer 46 is adjusted according to the relationship of the side wall portions of: the ridge portion<the side portions 49 of the ridge. The density of the reactive ion is decreased as the formation of the film on the side walls of the ridge progresses, and the growth rate of the film decreases more than that in the regions other than the ridge. Therefore, the embedded layer 46 is formed with a thickness in the relationship of side portions 49 of ridge<regions other than ridge. Accordingly, the thickness of the embedded layer 46 has a relationship of: side wall portions of ridge<side portions 49 of ridge<regions other than ridge.

Next, the entire upper surface of the wafer is again covered with a photoresist and etching is carried out on the photoresist until the p-electrode 38 on the ridge portion 36 is exposed. Then, the $SiO_2$ on the p-electrode 38 and the end surface portion of the resonator is removed. Next, a protective film 48 made of a Si oxide ($SiO_2$) is deposited by sputtering with a thickness of 0.5 m, over the embedded film and on the side surfaces of the semiconductor layer.

Next, continuously to the p-electrode 38 exposed in the previous step, a p-pad electrode 40 made of Ni(8 nm)/Pd(200 nm)/Au(800 nm) is formed. Next, polishing is carried out from the opposite surface to the growth surface of the nitride semiconductor layer so as to obtain a thickness of the substrate 2 of 80 m. Next, on the polished surface, an n-electrode 42 made of V(10 nm)/Pt(200 nm)/Au(300 nm) is formed. Next, the wafer is divided into a piece-wise shape by using laser and cleaved along the (1-100) plane as the cleavage surface to form the resonator end surfaces. Next, a mirror made of $SiO_2/ZrO_2$ is formed on the both of the end surfaces. Finally, the bar-shaped wafers are cut perpendicular to the resonator end surfaces to obtain semiconductor laser elements.

In the nitride semiconductor laser diode thus formed, dislocations of about $2\times10^6$ cm$^{-2}$ occur from the active layer 6. The Mg concentration profile in the p-side nitride semiconductor layer 8 shows, as in Example 1, Mg concentration of a local maximum value of $1\times10^{19}$/cm$^3$ and a local minimum value of $1.2\times10^{18}$/cm$^3$. The lasing wavelength is 500 nm, the threshold current is 25 mA, and the output power is 5 mW. Life test at 60° C., APC, and 5 mW shows a result as shown in FIG. 10, the estimated operating life at 60° C. is about 50,000 hours.

Comparative Example 1

The concentration of Mg incorporated in the p-type $Al_{0.2}Ga_{0.8}N$ layer 26 (first p-type nitride semiconductor layer) is $4.3\times10^{18}$ cm$^{-3}$, the concentration of Mg incorporated in the p-type $Al_{0.03}Ga_{0.97}N$ layers 28a, 28b (second p-type nitride semiconductor layer) is $5.6\times10^{17}$ cm$^{-3}$, $1.4\times10^{18}$ cm$^{-3}$ respectively. The nitride semiconductor laser is manufactured in the same manner as in Example 1 except for that described above. Dislocations of about $2\times10^6$ cm$^{-2}$ occur from the active layer 6. The Mg concentration profile in the p-side nitride semiconductor layer 8 is as shown in FIG. 8, the Mg concentration has a local maximum value of $4.3\times10^{18}$/cm$^{-3}$ and a local minimum value of $5.6\times10^{17}$/cm$^{-3}$. The lasing wavelength is 500 nm, the threshold current is 30 mA, and output is 5 mW. Life test at 60 C., APC, and 5 mW shows a result as shown in FIG. 6, the operating life at 60 C. is about 40 hours.

Example 2

In Example 1, the composition of the well layer is $In_{0.25}Ga_{0.73}N$, with a thickness of 2.5 nm, and the number of the well layers is 3. The concentration of Mg incorporated in the p-type $Al_{0.2}Ga_{0.8}N$ layer 26 (first p-type nitride semiconductor layer) is $2\times10^{19}$ cm$^{-3}$, the concentration of Mg incorporated in the p-type $Al_{0.03}Ga_{0.97}N$ layers 28a, 28b (second p-type nitride semiconductor layer) is $2\times10^{18}$ cm$^{-3}$, $4\times10^{18}$ cm$^{-3}$ respectively. The nitride semiconductor laser is manufactured in the same manner as in Example 1 except for that described above. Dislocations of about $5\times10^6$ cm$^{-2}$ occur from the active layer 6. The lasing wavelength is 517 nm, the threshold current is 70 mA, and output is 5 mW. Life test at 60 C., APC, and 5 mW shows an estimated operating life is 10,000 hours or greater.

Example 3

In Example 1, the composition of the well layer is $In_{0.27}Ga_{0.73}N$, with a thickness of 2.2 nm, and the number of the well layers is 4. The concentration of Mg incorporated in the p-type $Al_{0.2}Ga_{0.8}N$ layer 26 (first p-type nitride semiconductor layer) is $3\times10^{19}$ cm$^{-3}$, the concentration of Mg incorporated in the p-type $Al_{0.03}Ga_{0.97}N$ layers 28a, 28b (second p-type nitride semiconductor layer) is $3\times10^{18}$ cm$^{-3}$, $6\times10^{18}$ cm$^{-3}$ respectively. The nitride semiconductor laser is manufactured in the same manner as in Example 1 except for that described above. Dislocations of about $7.5\times10^6$ cm$^{-2}$ occur from the active layer 6. Lasing occurs at 540 nm, and a life test at 60° C., APC, and 5 mW shows a significantly preferable operating life characteristics compared to that of Comparative Example.

Example 4

In Example 1, the composition of the well layer is $In_{0.3}Ga_{0.7}N$, with a thickness of 2 nm, and the number of the well layers is 4. The concentration of Mg incorporated in the p-type $Al_{0.2}Ga_{0.8}N$ layer 26 (first p-type nitride semiconductor layer) is $5\times10^{19}$ cm$^{-3}$, the concentration of Mg incorporated in the p-type $Al_{0.03}Ga_{0.97}N$ layers 28a, 28b (second p-type nitride semiconductor layer) is $5\times10^{18}$ cm$^{-3}$, $1\times10^{19}$ cm$^{-3}$ respectively. The nitride semiconductor laser is manufactured in the same manner as in Example 1 except for that described above. Dislocations of about $1\times10^7$ cm$^{-2}$ occur from the active layer 6. Lasing occurs at 560 nm, and a life test at 60° C., APC, and 5 mW shows a significantly preferable operating life characteristics compare to that of Comparative Example.

Example 5

In Example, growth of the p-type $Al_{0.03}Ga_{0.97}N$ layers 28a, 28b (second p-type nitride semiconductor layers) is omitted and a layer 32 having the thickness of 0.45 m is grown directly on the p-type $Al_{0.2}Ga_{0.8}N$ layer 26 (first p-type nitride semiconductor layer). The first 0.15 m of the layer 32 is grown with undoped layers of $Al_{0.06}Ga_{0.94}N$ layer and $Al_{0.12}Ga_{0.88}N$ layer, and the rest of the 0.3 m is grown with $Al_{0.06}Ga_{0.94}N$ layer doped with Mg of a concentration the same as in Example 1. Because the layer 32 has a larger band gap (i.e. smaller refractive index) than that of the layers 28a, 28b, the optical confinement is enhanced and also the optical absorption due to doping with Mg can be reduced. Dislocations of about $2\times10^6$ cm$^{-2}$ occur from the active layer 6. The Mg concentration profile in the p-side nitride semiconductor layer 8 shows, as in Example 1, Mg concentration of a local maximum value of $1\times10^{19}$/cm$^3$ and a local minimum value of $1.2\times10^{18}$/cm$^3$. Lasing occurs at 500 nm. Although the threshold current is rather high than that of Example 1, a life test at 60° C., APC, and 5 mW shows nearly the same operating life as in Example 1.

Example 6

In Example 1, the Mg concentration in the p-type $Al_{0.03}Ga_{0.07}N$ layers 28a, 28b (second p-type nitride semiconductor layer) is set to a constant value of $3 \times 10^{18}/\text{cm}^{-3}$ as shown below. After the layer 26 is grown, maintaining the growth temperature at a constant level, a Mg raw material is supplied only for the beginning of growth of 10 nm, then the supply of the Mg raw material is stopped. After about 50 nm of the growth from there, the supply of the Mg raw material is restarted, then the flow of the Mg raw material gas is gradually reduced. With this, the p-type $Al_{0.03}Ga_{0.97}N$ layers 28a, 28b can be formed with the Mg concentration constantly distributed in the entire layers. As in Example 1, dislocations of about $2 \times 10^6$ cm$^{-2}$ occur from the active layer 106. The Mg concentration profile in the p-side nitride semiconductor layer 8 shows, Mg concentration of a local maximum value of $1 \times 10^{19}/\text{cm}^3$, but thereafter, shows a constant value of $3 \times 10^{18}/\text{cm}^3$ in the p-type $Al_{0.03}Ga_{0.97}N$ layers 28a, 28b. Lasing occurs at 500 nm. Although the threshold current reaches 50 mA, a life test at 60° C., APC, and 5 mW shows nearly the same operating life as in Example 1.

Example 7

In Example 1, the barrier layer 22c is grown so that the band gap increases in a continuous manner or a stepwise manner. In the same manner as in Example 1, the barrier layer 22c made of undoped $In_{0.04}Ga_{0.96}N$ is grown to 70 nm, and then, an undoped AlInGaN layer (for example GaN, AlGaN) having larger band gap than the barrier layer 22c is grown to a thickness of 20 nm. Thereafter, in the same manner as in Example 1, the p-side nitride semiconductor layer 8 is grown. With this arrangement, optical confinement is enhanced without an increase of the thickness of the p-side nitride semiconductor layer 8, so that operating voltage decreases. A life test at 60° C., AOC, and 5 mW shows nearly the same operating life as in Example 1.

Example 8

In Example 1, the growth of layer 32 (third p-type nitride semiconductor layer), in which a 2.5 nm thickness of Mg-doped $Al_{0.06}Ga_{0.94}N$ layer, a 2.5 nm thickness of undoped $Al_{0.12}Ga_{0.88}N$ layer are alternately grown, is omitted. Also, ITO is used as the p-electrode in place of Ni/Au/Pt. The nitride semiconductor laser is manufactured in the same manner as in Example 1 except for that described above. The p-electrode 38 made of ITO serves as the cladding layer in place of the layer 32. The thickness of the p-side nitride semiconductor layer 8 is reduced accordingly, so that the driving current decreases. The same level of properties as in Example 1 can be obtained except that described above.

Example 9

In Example 1, the composition of the fourth n-side nitride semiconductor layers 18a, 18b is changed from GaN to AlGaN which contains a smaller amount of Al than the third n-side nitride semiconductor layer 16. The nitride semiconductor laser is manufactured in the same manner as in Example 1 except for that described above. Approximately the same level of properties as in Example 1 can be obtained.

Example 10

In Example 1, the entire fourth n-side nitride semiconductor layers 18a, 18b are made undoped. The nitride semiconductor laser is manufactured in the same manner as in Example 1 except that described above. The same level of properties as in Example 1 can be obtained.

Example 11

In Example 1, next, the temperature is set to 990° C., and the thickness of the n-type $Al_{0.09}Ga_{0.91}N$ layer doped with Si of $2 \times 10^{18}/\text{cm}^3$ (third n-side nitride semiconductor layer 16) is set to 2 m. The nitride semiconductor laser is manufactured in the same manner as in Example 1 except for that described above. Amount of leakage of light to the substrate side is reduced compared to that in Example 1 and the FFP-Y shape is improved. Approximately the same level of properties as in Example 1 can be obtained except that described above.

Example 12

In Example 1, GaN is used for the barrier layer 22b and formed with a two-layer structure of InGaN and GaN, with a smaller amount of In than in the well layer. The nitride semiconductor laser is manufactured in the same manner as in Example 1 except for that described above. The driving current decreases compared to that in Example 1. The same level of properties as in Example 1 can be obtained except that described above.

Example 13

In Example 1, the well-cap layer is changed from GaN to AlInGaN. The nitride semiconductor laser is manufactured in the same manner as in Example 1 except that described above. The same level of properties as in Example 1 can be obtained.

What is claimed is:

1. A nitride semiconductor laser diode comprising:
   a substrate;
   an n-side nitride semiconductor layer containing an n-type impurity and disposed on the substrate;
   an active layer having a light emitting layer including $In_xAl_yGa_{1-x-y}N$ ($0<x<1$, $0\leq y<1$, and $0<x+y<1$) and disposed on the n-side nitride semiconductor layer; and
   a p-side nitride semiconductor layer containing a p-type impurity and disposed on the active layer;
   wherein a lasing wavelength of the nitride semiconductor laser diode is 500 nm or greater,
   dislocations originated in the active layer penetrate through the p-side nitride semiconductor layer with a dislocation density of $1 \times 10^6$ cm$^{-2}$ or greater, and
   a concentration distribution of the p-type impurity in a depth direction from the light emitting layer toward the surface of the p-side nitride semiconductor layer has a local maximum with the concentration of the p-type impurity of $5 \times 10^{18}$ cm$^{-3}$ or greater in a range within 300 nm from the top surface of the light emitting layer which is closest to the p-side nitride semiconductor layer, and after passing the local maximum, the concentration of the p-type impurity is not less than $6 \times 10^{17}$ cm$^{-3}$ in the range within 300 nm.

2. The nitride semiconductor diode according to claim 1, wherein the local maximum is arranged within 150 nm from the top surface of the light emitting element which is closest to the p-side nitride semiconductor layer.

3. The nitride semiconductor laser diode according to claim 1, wherein the concentration distribution of the p-type impurity in a depth direction reaches a local minimum of not less than $6 \times 10^{17}$ cm$^{-3}$ after passing the local maximum and in the range within 300 nm and, after passing the local minimum, increases to $1 \times 10^{18}$ cm$^{-3}$ or greater.

4. The nitride semiconductor diode according to claim 3, wherein the local minimum is arranged within 250 nm from the top surface of the light emitting element which is closest to the p-side nitride semiconductor layer.

5. A nitride semiconductor laser diode comprising;
a substrate;
an n-side nitride semiconductor layer containing an n-type impurity and disposed on the substrate;
an active layer of a quantum well structure including a well layer including $In_xAl_yGa_{1-x-y}N$ ($0<x<1$, $0\leq y<1$, $0<x+y<1$), and disposed on the n-side nitride semiconductor layer; and
a p-side nitride semiconductor layer containing a p-type impurity and disposed on the active layer;
wherein the n-side nitride semiconductor layer includes a GaN layer or AlGaN layer
the well layer in the active layer has a lasing wavelength of 500 nm or greater,
dislocations originated in the well layer penetrate through the p-side nitride semiconductor layer so that a dislocation density is $1\times10^6$ cm$^{-2}$ or greater in the p-side nitride semiconductor layer, and
wherein the nitride semiconductor laser diode comprises a first p-type nitride semiconductor layer in a range within 300 nm from the top surface of the well layer which is closest to the p-side nitride semiconductor layer, the first p-type nitride semiconductor layer being made of an Al-containing nitride semiconductor, having a bandgap larger than that of the well layer and having a p-type impurity concentration of $5\times10^{18}$ cm$^{-3}$ or greater and
a second p-type semiconductor layer on the first p-type nitride semiconductor layer, the second p-type semiconductor layer having, within the 300 nm range, a p-type impurity concentration smaller than a p-type impurity concentration in the first p-type semiconductor layer and not smaller than $6\times10^{17}$ cm$^{-3}$.

6. The nitride semiconductor diode according to claim 5, wherein the first p-type nitride semiconductor layer is located within 150 nm from the top surface of the well layer which is closest to the p-side nitride semiconductor layer.

7. The nitride semiconductor laser diode according to claim 5, wherein the concentration of the p-type impurity in the second p-type nitride semiconductor layer decreases with distance from an interface closer to the first p-type nitride semiconductor layer to a degree not less than $6\times10^{17}$ cm$^{-3}$, and then increases toward an interface of the opposite side.

8. The nitride semiconductor diode according to claim 5, wherein the concentration of the p-type impurity in the second p-type nitride semiconductor layer has a local minimum within 250 nm from the top surface of the well layer which is closest to the p-side nitride semiconductor layer.

9. The nitride semiconductor diode according to claim 5, wherein the concentration of p-type impurity in the second p-type nitride semiconductor layer is $1\times10^{18}$ cm$^{-3}$ or greater at a location 300 nm from the top surface of the well layer which is closest to the p-side nitride semiconductor layer.

10. The nitride semiconductor laser diode according to claim 5, having a third p-type nitride semiconductor layer on the second p-type nitride semiconductor layer, the third p-type nitride semiconductor layer having a band gap larger than the band gap of the second p-type nitride semiconductor layer and smaller than the band gap of the first p-type nitride semiconductor layer.

11. A nitride semiconductor laser diode comprising:
a substrate;
an n-side nitride semiconductor layer containing an n-type impurity and disposed on the substrate;
an active layer of a multi quantum well structure having a well layer including $In_xAl_yGa_{1-x-y}N$ ($0<x<1$, $0\leq y<1$, $0<x+y<1$), and disposed on the n-side nitride semiconductor layer; and
a p-side nitride semiconductor layer containing a p-type impurity and disposed on the active layer;
wherein the n-side nitride semiconductor layer includes a GaN layer or AlGaN layer,
the active layer includes a well layer having lasing wavelength of 500 nm or greater and a barrier layer located closest to the p-side in the active layer and having a thickness of 300 nm or less,
the p-side nitride semiconductor layer includes, from the side closer to the active layer,
a first p-type nitride semiconductor layer made of a nitride semiconductor containing Al having a band gap larger than the band gap of the well layer, having a p-type impurity with a concentration of $5\times10^{18}$ cm$^{-3}$ or greater, and having a thickness of 3 to 50 nm,
a second p-type nitride semiconductor layer having a p-type impurity concentration smaller than a p-type impurity concentration of the first semiconductor layer and not smaller than $6\times10^{17}$ cm$^{-3}$,
a third p-type nitride semiconductor layer having a band gap larger than the band gap of the second p-type nitride semiconductor layer and smaller than the band gap of the first p-type nitride semiconductor layer, and
a fourth p-type nitride semiconductor layer having a p-type impurity concentration of $5\times10^{19}$ cm$^3$ or greater;
wherein dislocations originated in the well layer penetrate through the p-side nitride semiconductor layer and the dislocation density of the p-side nitride semiconductor layer is $1\times10^6$ cm$^{-2}$ or greater.

12. The nitride semiconductor laser diode according to claim 1, wherein the lasing wavelength is 560 nm or less.

13. The nitride semiconductor laser diode according to claim 1, wherein the substrate is made of a nitride semiconductor having a dislocation density of $1\times10^7$ cm$^{-2}$ or less.

14. The nitride semiconductor laser diode according to claim 1, wherein the dislocation density of the substrate is lower than the dislocation density generated in the active layer.

15. A display apparatus comprising a nitride semiconductor laser diode having a lasing wavelength of 500 to 560 nm according to claim 1, a nitride semiconductor laser diode having a lasing wavelength of 440 to 480 nm, and a nitride semiconductor laser diode having a lasing wavelength of 600 to 660 nm.

* * * * *